(12) United States Patent
Kim et al.

(10) Patent No.: US 11,638,400 B2
(45) Date of Patent: May 2, 2023

(54) LIGHT SOURCE FOR PLANT CULTIVATION

(71) Applicant: SEOUL VIOSYS CO., LTD., Gyeonggi-do (KR)

(72) Inventors: Se Ryung Kim, Gyeonggi-do (KR); Sang Min Ko, Gyeonggi-do (KR); Jin Won Kim, Gyeonggi-do (KR); Hyun Su Song, Gyeonggi-do (KR)

(73) Assignee: Seoul Viosys Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/897,925

(22) Filed: Aug. 29, 2022

(65) Prior Publication Data

US 2023/0000022 A1 Jan. 5, 2023

Related U.S. Application Data

(63) Continuation of application No. 17/022,531, filed on Sep. 16, 2020, now Pat. No. 11,432,473, which is a
(Continued)

(51) Int. Cl.
*A01G 7/04* (2006.01)
*A01G 9/20* (2006.01)
(Continued)

(52) U.S. Cl.
CPC .............. *A01G 7/045* (2013.01); *A01G 9/20* (2013.01); *H05B 45/20* (2020.01); *H05B 47/16* (2020.01);
(Continued)

(58) Field of Classification Search
CPC ......... A01G 7/045; H05B 45/20; H05B 47/16
See application file for complete search history.

(56) References Cited

U.S. PATENT DOCUMENTS

| 8,373,363 | B2 | 2/2013 | Grajcar |
| 8,531,136 | B2 | 9/2013 | Grajcar |

(Continued)

FOREIGN PATENT DOCUMENTS

| CN | 207083572 U | 3/2018 |
| JP | 2003339236 A | 12/2003 |

(Continued)

OTHER PUBLICATIONS

International Search Report for International Application No. PCT/KR2019/010771, dated Nov. 29, 2019, 5 pages.
(Continued)

*Primary Examiner* — Anne M Hines
(74) *Attorney, Agent, or Firm* — LaBatt, LLC

(57) ABSTRACT

A plant cultivation light source includes a plurality of light sources configured to be turned on or turned off depending on a selected plant and a growth stage of the selected plant, and a controller. The controller is operable to turn on the light sources during a light period such that the light sources are operable to emit a light having a spectrum with a plurality of peaks to the selected plant. The light period including a first period and a second period and the first period preceding or following the second period. The controller is operable to adjust the spectrum of the light to alternate the first period and the second period during the light period.

20 Claims, 23 Drawing Sheets

Related U.S. Application Data continuation of application No. 16/548,337, filed on Aug. 22, 2019, now Pat. No. 10,820,532.

(60) Provisional application No. 62/870,905, filed on Jul. 5, 2019, provisional application No. 62/722,389, filed on Aug. 24, 2018.

(51) Int. Cl.
  *H05B 45/20* (2020.01)
  *H05B 47/16* (2020.01)
  *A01G 31/02* (2006.01)
  *H01L 33/32* (2010.01)
  *H01L 33/38* (2010.01)
  *H01L 33/40* (2010.01)
  *H01L 25/075* (2006.01)

(52) U.S. Cl.
  CPC .......... *A01G 31/02* (2013.01); *H01L 25/0753* (2013.01); *H01L 33/325* (2013.01); *H01L 33/38* (2013.01); *H01L 33/40* (2013.01)

(56) References Cited

U.S. PATENT DOCUMENTS

| | | |
|---|---|---|
| 8,596,804 B2 | 12/2013 | Grajcar |
| 8,643,308 B2 | 2/2014 | Grajcar |
| 8,651,691 B2 | 2/2014 | Grajcar |
| 10,820,532 B2 | 11/2020 | Kim |
| 11,125,405 B2 | 9/2021 | Song |
| 11,291,164 B2 | 4/2022 | Kim et al. |
| 11,432,473 B2 | 9/2022 | Kim et al. |
| 2005/0135104 A1 | 6/2005 | Crabb et al. |
| 2007/0058368 A1 | 3/2007 | Partee et al. |
| 2008/0302004 A1 | 12/2008 | Lin |
| 2010/0020536 A1 | 1/2010 | Bafetti et al. |
| 2011/0016785 A1 | 1/2011 | Yamada et al. |
| 2011/0101883 A1 | 5/2011 | Grajcar |
| 2011/0109244 A1 | 5/2011 | Grajcar |
| 2011/0163246 A1 | 7/2011 | Ishiwata et al. |
| 2011/0179706 A1 | 7/2011 | Hunt et al. |
| 2011/0209400 A1 | 9/2011 | Rooymans |
| 2011/0228515 A1 | 9/2011 | Grajcar |
| 2011/0273098 A1 | 11/2011 | Grajcar |
| 2012/0075848 A1 | 3/2012 | Yamada et al. |
| 2012/0268918 A1 | 10/2012 | Grajcar |
| 2013/0040380 A1 | 2/2013 | Hunt et al. |
| 2013/0301258 A1* | 11/2013 | Aoki ...................... A61L 2/084 362/231 |
| 2014/0069007 A1 | 3/2014 | Chen et al. |
| 2014/0152194 A1 | 6/2014 | Beyer |
| 2014/0250778 A1 | 9/2014 | Suntych |
| 2015/0128488 A1 | 5/2015 | Casper et al. |
| 2015/0128489 A1 | 5/2015 | Yamada et al. |
| 2015/0150195 A1 | 6/2015 | Grajcar |
| 2015/0216130 A1 | 8/2015 | Grajcar et al. |
| 2015/0273235 A1 | 10/2015 | Grajcar |
| 2016/0014974 A1 | 1/2016 | Grajcar et al. |
| 2016/0113213 A1 | 4/2016 | Berinsky |
| 2016/0205739 A1* | 7/2016 | Grajcar .................. H05B 45/46 315/210 |
| 2018/0028700 A1 | 2/2018 | Dobrinsky et al. |
| 2018/0092308 A1 | 4/2018 | Barber, III et al. |
| 2020/0060099 A1 | 2/2020 | Kim et al. |
| 2020/0149060 A1* | 5/2020 | Wargent ................. A01G 22/00 |
| 2022/0003370 A1 | 1/2022 | Song et al. |

FOREIGN PATENT DOCUMENTS

| | | |
|---|---|---|
| JP | 2009-261311 | 11/2009 |
| JP | 2012205520 A | 10/2012 |
| JP | 2013123417 A | 6/2013 |
| JP | 5652954 B2 | 1/2015 |
| KR | 1020100135919 B1 | 12/2010 |
| WO | 2017188719 A1 | 11/2017 |

OTHER PUBLICATIONS

International Search Report for International Application No. PCT/KR2019/010772, dated Nov. 29, 2019, 5 pages.
Non-Final Office Action issued in U.S. Appl. No. 16/548,337, dated Jan. 31, 2020, 16 pages.
Final Office Action issued in U.S. Appl. No. 16/548,337, dated Apr. 23, 2020, 17 pages.
Notice of Allowance issued in U.S. Appl. No. 16/548,337, dated Jul. 17, 2020, 10 pages.
Non-Final Office Action issued in U.S. Appl. No. 16/536,222, dated Dec. 3, 2020, 12 pages.
Notice Of Allowance issued in U.S. Appl. No. 16/536,222, dated May 21, 2021, 12 pages.
Non-Final Office Action issued in U.S. Appl. No. 16/548,350, dated Jul. 6, 2021, 12 pages.
Final Office Action issued in U.S. Appl. No. 16/548,350, dated Nov. 10, 2021, 8 pages.
Notice of Allowance issued in U.S. Appl. No. 16/548,350, dated Feb. 8, 2022, 8 pages.
Notice of Allowance issued in U.S. Appl. No. 17/022,531, dated May 3, 2022, 9 pages.
European Search Report for European Application No. 19853039.6, dated Feb. 4, 2022, 9 pages.
Office Action issued in corresponding CN Application No. 201980003184.8, dated Feb. 25, 2022, English translation, 24 pages.
Office action for Japanese Patent Application No. 2021-509838 with English translation, dated Mar. 7, 2023, 10 pages.

* cited by examiner

FIG. 4

| | Start point | Time lapse (day) | | | | |
|---|---|---|---|---|---|---|
| Control group | Sowing | Dark period | Irradiation period before transplanting | First period | | Harvesting |
| Treatment goup 1 | Sowing | Dark period | Irradiation period before transplanting | First period | First period + Second period | Harvesting |
| Treatment goup 2 | Sowing | Dark period | Irradiation period before transplanting | First period | First period + Second period | Harvesting |
| Treatment goup 3 | Sowing | Dark period | Irradiation period before transplanting | First period | First period + Second period | Harvesting |

FIG. 5

| | Characteristics | Time lapse (hour) | |
|---|---|---|---|
| Light condition | - | Dark period | Light period |
| Comparative example 1 | - | - | First period |
| Experimental example 1 | UVB | - | Second period |
| Experimental example 2 | UVA | - | Second period |

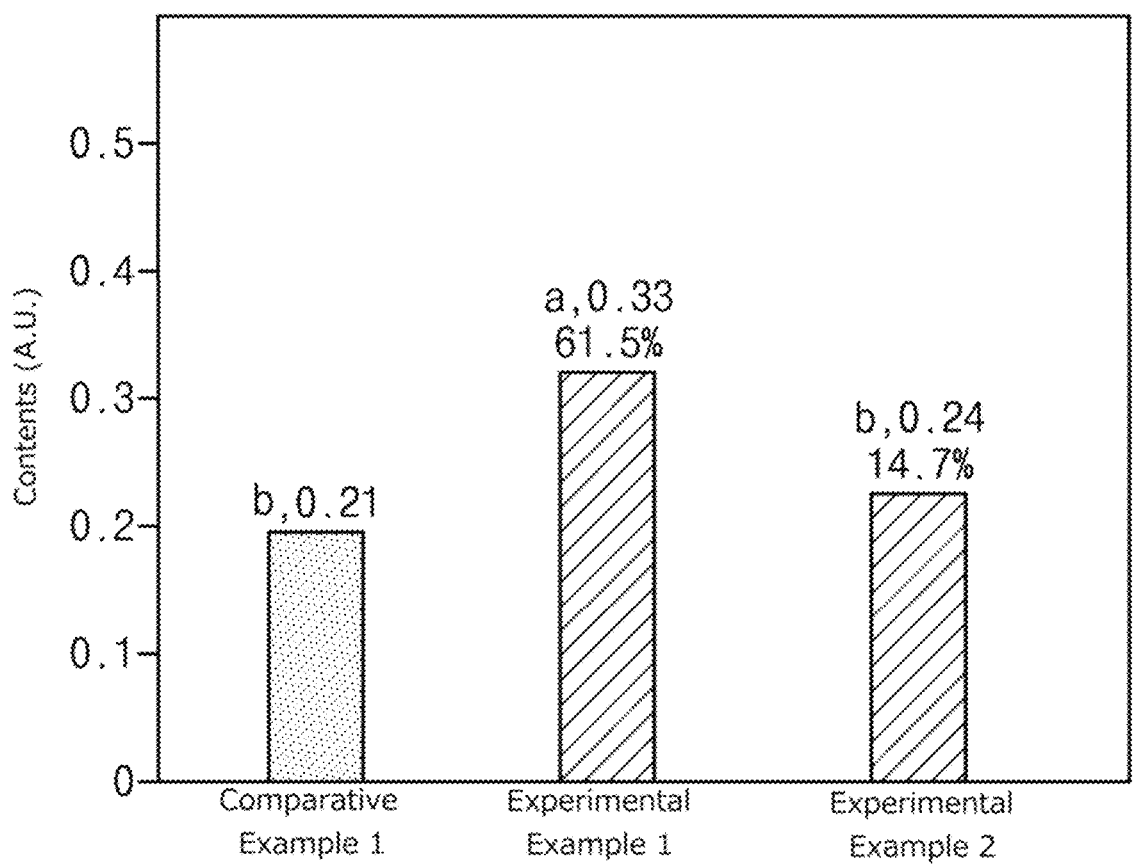

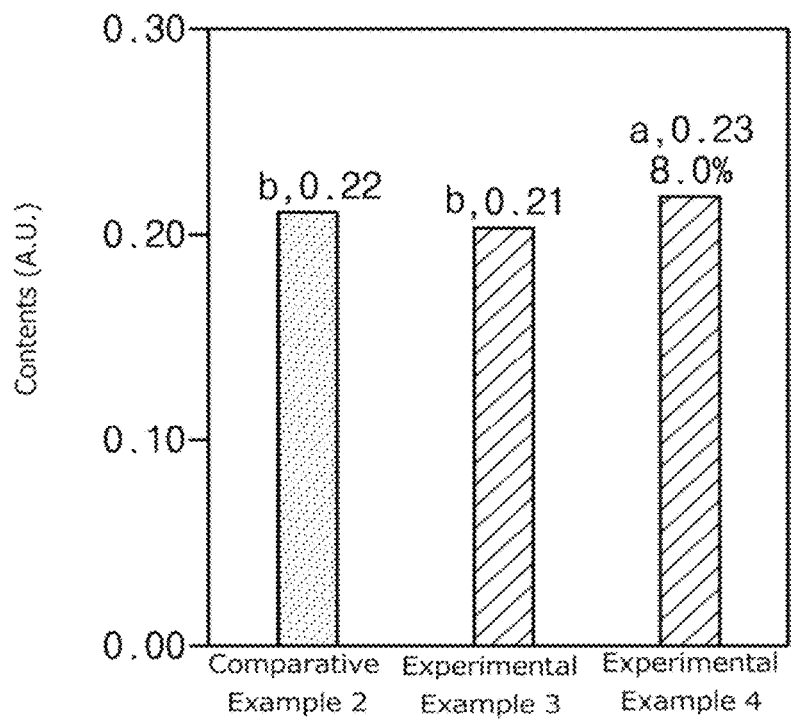

FIG. 16
| Characteristics | | Time lapse(hour) | |
|---|---|---|---|
| Light condition | | Dark period | Light period |
| Comparative example | | | First period |
| Experimental example | 3 hours | Second period | First period |
FIG. 17A
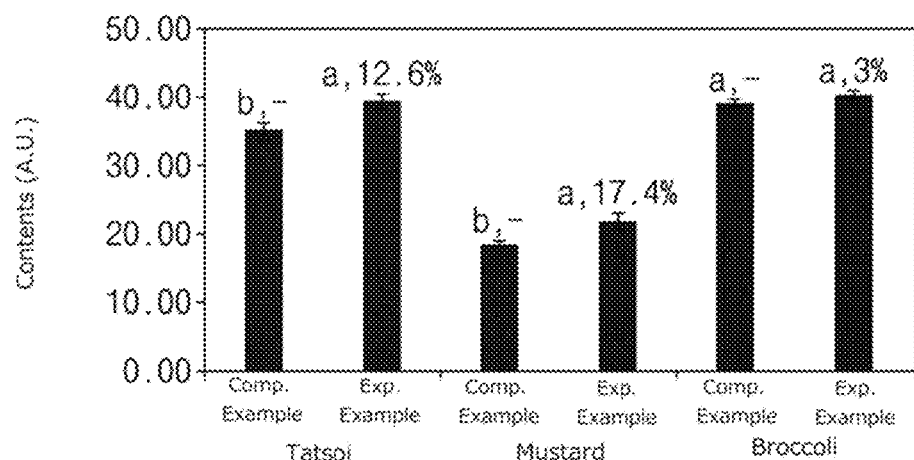
FIG. 17B
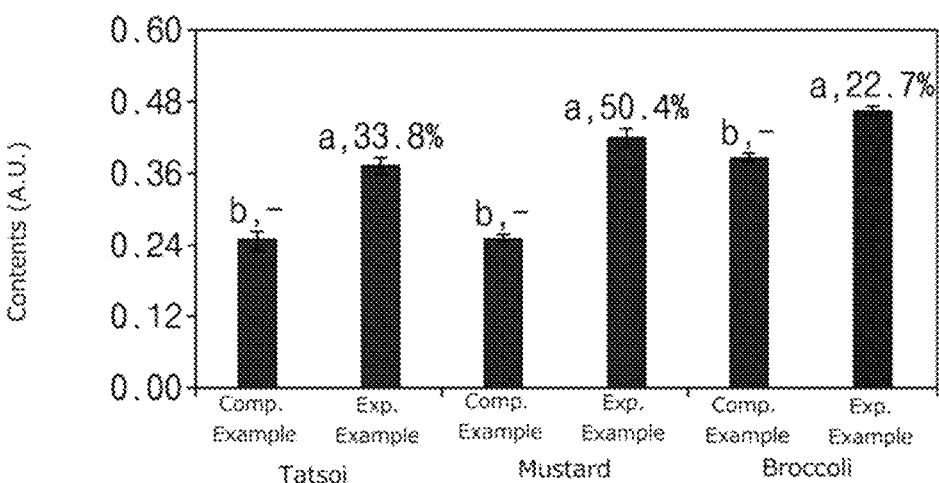

LIGHT SOURCE FOR PLANT CULTIVATION

CROSS-REFERENCE TO RELATED APPLICATIONS AND PRIORITY

This application is a continuation of U.S. patent application Ser. No. 17/022,531, filed on Sep. 16, 2020, which is a continuation of U.S. patent application Ser. No. 16/548,337 filed on Aug. 22, 2019, which claims priority to and the benefit of U.S. Provisional Application Nos. 62/870,905, filed on Jul. 5, 2019, and 62/722,389, filed on Aug. 24, 2018, the disclosures of which are hereby incorporated by reference for all purposes as if fully set forth herein.

BACKGROUND

1. Field of Disclosure

The present disclosure relates to a light source for plant cultivation. More particularly, the present disclosure relates to a light source that emits a light optimized for plant photosynthesis.

2. Description of the Related Art

Various light sources replacing sunlight are being developed and being used as lighting for plant cultivation. Conventionally, incandescent lamps and fluorescent lamps are mainly used as the lightings for plant cultivation. However, the conventional lightings for plant cultivation provide light having a specific wavelength to plants for only the purpose of plant photosynthesis, and most of them do not have any additional functions.

Plants synthesize substances useful to humans while resisting a variety of stress factors, and there is a need for a light source, a cultivation device, and a cultivation method to cultivate plants that contain a large amount of substances useful to humans.

SUMMARY

The present disclosure provides a light source capable of cultivating a plant containing a large amount of substances useful to humans. The present disclosure provides a cultivation device capable of easily cultivating the plant using the light source. The present disclosure provides a cultivation method capable of easily cultivating the plant using the light source or the cultivation device.

Embodiments of the present disclosure provide a plant cultivation light source which includes a plurality of light sources configured to be turned on or turned off depending on a selected plant and a growth stage of the selected plant, and a controller. The controller is operable to turn on the light sources during a light period such that the light sources are operable to emit a light having a spectrum with a plurality of peaks to the selected plant. The light period including a first period and a second period and the first period preceding or following the second period. The controller is operable to adjust the spectrum of the light to: (i) provide, in the first period, a first pattern having peaks of the light that appear at one or more wavelengths, (ii) provide, in the second period, a second pattern having peaks of the light that appear at the wavelengths being similar or identical to the wavelengths of the first pattern, (iii) further provide, in the second period, at least one peak of the light that appears at a wavelength equal to or smaller than about 300 nm, and (iv) alternate the first period and the second period during the light period.

In some embodiment, the light sources emit the light having the first pattern in the first period that enables photosynthesis of the selected plant.

In some embodiments, the controller further controls the light sources to continuously irradiate the light in the second period. In other embodiments, the controller further controls the light sources to irradiate the light in the second period in a flickering manner.

In some embodiments, the first period is longer than the second period. The controller further controls the light sources to continuously irradiate the light in the first period.

In some embodiments, a plant cultivation light source includes a plurality of light sources and a controller. The plurality of light sources is configured to be turned on or turned off depending on a selected plant and a growth stage of the selected plant. The light sources includes a first light source and a second light source. The controller is operable to turn on the light sources during a light period such that the light sources are operable to emit a light having a spectrum with a plurality of peaks to the selected plant. The light period includes a first period and a second period and the first period preceding or following the second period. The controller is operable to adjust the spectrum of the light to: (i) provide with the first light source, in the first period, a first pattern having peaks of the light that appear at one or more wavelengths to be used in photosynthesis of the selected plant; (ii) provide with both the first light source and the second light source, in the second period, a second pattern having peaks of the light that appear at the wavelengths being similar or identical to the wavelengths of the first pattern; and (iii) further provide, in the second period, at least one peak of the light that appears at a wavelength equal to or smaller than about 320 nm. During the light period, the second period does not exceed the first period.

In some embodiments, the controller is further operable to alternate the first period and the second period during the light period. In some embodiments, the controller further controls the light sources to continuously irradiate the light in the second period. In other embodiments, the controller further controls the light sources to irradiate the light in the second period in a flickering manner. The controller further controls the light sources to continuously irradiate the light in the first period. The controller further controls the light sources to continuously irradiate UVB in the second period.

In some embodiments, a method for operating a light source for plant cultivation includes steps of turning on or off a plurality of light sources depending on a selected plant and a growth stage of the selected plant during a light period, the plurality of light sources comprising a first light source and a second light source, and controlling, with a controller, the light sources during a light period to emit a light having a spectrum with a plurality of peaks to the selected plant. The light period includes a first period and a second period and the first period preceding or following the second period. The method further includes steps of adjusting, with the controller, the spectrum of the light to: provide, in the first period, a first pattern having peaks of the light that appear at one or more wavelengths; provide, in the second period, a second pattern having peaks of the light that appear at the wavelengths being similar or identical to the wavelengths of the first pattern; further provide, in the second period, at least one peak of the light that appears at a wavelength equal to or smaller than about 300 nm; and alternate the first period and the second period during the light period.

In some embodiments, the method further includes continuously irradiating the light in the second period. In other embodiments, the method further includes irradiating the light in the second period in a flickering manner. The method further includes continuously irradiating the light in the first period.

In some embodiments, the step of adjusting the spectrum of the light further includes providing with the first light source, in the first period, the first pattern having the peaks of the light and providing with both the first light source and the second light source, in the second period, the second pattern and the at least one peak of the light.

Embodiments of the present disclosure provide a plant cultivation light source being turned on or turned off depending on a light period and a dark period of a plant. The plant cultivation light source is turned on in the light period and emits a light having a spectrum with a plurality of peaks to the plant to increase a content of a predetermined substance in the plant. When a portion of the light period is referred to as a first period and the other portion of the light period is referred to as a second period, at least one peak of the peaks of the light emitted in the second period of the light period is not provided in the first period preceding or following the second period, and the other peaks appear at substantially the same wavelength in the second period and the first period except for the at least one peak provided in the second period and not provided in the first period.

The at least one peak provided in the second period and not provided in the first period appears at a wavelength equal to or smaller than about 300 nm. The at least one peak provided in the second period and not provided in the first period has a wavelength of about from about 280 to about 295. The second period is shorter than the first period, or the second period is less than about 6 hours. The light is continuously emitted from the light source during the second period.

The dark period and the light period are repeated on a 24-hour basis, or a daily basis.

The predetermined substance includes at least one of chlorophylls, flavonols, and anthocyanins. The other peaks except for the at least one peak provided in the second period and not provided in the first period are provided in a visible light wavelength band. The other peaks except for the at least one peak provided in the second period and not provided in the first period include peaks respectively provided in a blue wavelength band and a red wavelength band.

The light source includes a plurality of light emitting diodes emitting lights having different wavelengths from each other. The light emitting diodes include a first light emitting diode providing the light corresponding to the at least one peak provided in the second period and not provided in the first period and a second light emitting diode providing the light corresponding to the other peaks except for the at least one peak.

According to an embodiment of the present disclosure, the light source is employed in a plant cultivation device, and the plant cultivation device includes a housing in which a plant is provided, a light source provided in the housing to irradiate a light to the plant, and a controller controlling the light source.

Embodiments of the present disclosure provide a method of cultivating a plant using the light source including germinating a seed of the plant, growing the germinated seed to a sprout, transplanting the sprout to grow the sprout to an adult plant, and irradiating a light to the adult plant right before harvesting the adult plant to increase a content of a predetermined substance in the plant. The irradiating of the light before harvesting the adult plant includes emitting a light having a spectrum with a plurality of peaks to the plant in a light period. When a portion of the light period is referred to as a first period and the other portion of the light period is referred to as a second period, at least one peak of the peaks of the light emitted in the second period of the light period is not provided in the first period preceding or following the second period, and the other peaks except for the at least one peak provided in the second period and not provided in the first period appear at substantially the same wavelength in the second period and the first period.

According to the above, the plants may be efficiently cultivated using the light source, and the content of the substances useful to humans may easily increase in the plants.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The above and other advantages of the present disclosure will become readily apparent by reference to the following detailed description when considered in conjunction with the accompanying drawings wherein:

FIG. 4 is a view showing growth conditions of kale according to an experimental example;

FIG. 5 is a view showing experimental conditions in an exemplary embodiment;

FIG. 6C is a graph sequentially showing contents of anthocyanins contained in kale harvested on the 31st day after the date of sowing, after the light treatment was performed in comparative example 1, experimental example 1, and experimental example 2;

FIG. 7 shows experimental conditions in an exemplary embodiment;

FIG. 9C is a graph sequentially showing contents of anthocyanins contained in kale harvested on the 31st day after the date of sowing in comparative example 2, experimental example 3 and experimental example 4;

FIG. 10 shows experimental conditions in an exemplary embodiment;

FIG. 16 shows experimental conditions in an embodiment;

FIG. 17A is a graph sequentially showing contents of chlorophylls contained in tatsoi, mustard, and broccoli harvested on the 31st day after the date of sowing, after the light treatment was performed in comparative examples and experimental examples according to the experimental conditions of FIG. 16;

FIG. 17B is a graph sequentially showing contents of flavonols contained in tatsoi, mustard, and broccoli harvested on the 31st day after the date of sowing, after the light treatment was performed in comparative examples and experimental examples according to the experimental conditions of FIG. 16;

DETAILED DESCRIPTION OF EMBODIMENTS

Figure 1A:
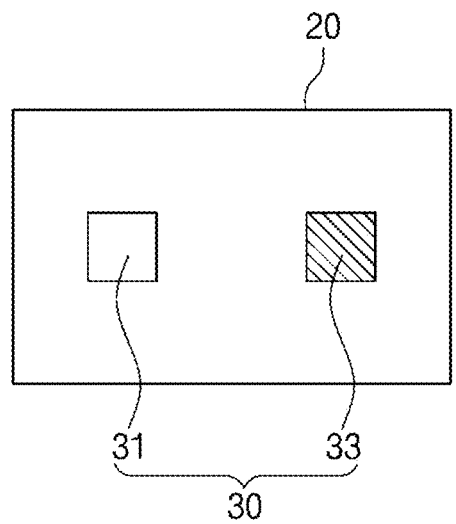
FIG. 1A is a plan view showing a light source for plant cultivation according to an exemplary embodiment of the present disclosure.

The present disclosure may be variously modified and realized in many different forms, and thus specific embodiments will be exemplified in the drawings and described in detail hereinbelow. However, the present disclosure should not be limited to the specific disclosed forms, and be construed to include all modifications, equivalents, or replacements included in the spirit and scope of the present disclosure.

Like numerals refer to like elements throughout. In the drawings, the thickness, ratio, and dimension of components are exaggerated for effective description of the technical content. It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure. As used herein, the singular forms, "a," "an" and "the" are intended to include the plural forms as well, unless the context clearly indicates otherwise.

It will be further understood that the terms "comprises" and/or "comprising," or "includes" and/or "including," when used in this specification, specify the presence of stated features, integers, steps, operations, elements, and/or components, but do not preclude the presence or addition of one or more other features, integers, steps, operations, elements, components, and/or groups thereof.

The present disclosure relates to a light source used to cultivate plants. Plants photosynthesize using a light in a visible light wavelength band and gain energy through photosynthesis. Photosynthesis of plants does not occur to the same extent in all wavelength bands. The light in a specific wavelength band that the plants use for photosynthesis in sunlight is called Photosynthetic Active Radiation (PAR), occupies a portion of solar spectrum, and corresponds to a band from about 400 nanometers to about 700 nanometers. The light source for plant cultivation according to an exemplary embodiment of the present disclosure includes the light in the PAR wavelength band to provide an appropriate light for plant photosynthesis, and the light source for plant cultivation provides a light in a wavelength band to increase the content of ingredients (hereinafter, referred to as an "active ingredients") that positively affect the health of humans or the plants upon ingestion. In this case, the active ingredients are substances known to be necessary for humans, such as chlorophylls, flavonols, anthocyanins and glucosinolates.

Chlorophylls are known as a photosynthetic pigment of green vegetables and help to prevent bad breath and constipation. Flavonols are antioxidants and include quercetin, kaempferol, and myricetin as its representative substances. Quercetin is an antioxidant with high antioxidant capacity, Kaempferol is known to prevent cancer cell proliferation by enhancing immunity, and Myricetin is known to inhibit the accumulation of fat to prevent cardiovascular disease. Anthocyanins are one of the representative antioxidants and have the effect of preventing aging by removing reactive oxygen species in human body. Anthocyanins also help re-synthesis of a pigment called rhodopsin in the eye's retina to prevent eye strain, decreased visual acuity, cataract.

When the glucosinolates are absorbed into human intestines, the glucosinolates may be degraded by intestinal microorganisms and converted to isothiocyanate. The glucosinolates are known to be effective against cancer and is effective for bladder cancer, breast cancer, and liver cancer. In particular, the glucosinolates have a superior ability to regulate leukocyte and cytokine and have an enzyme that inhibits tumor growth in breast, liver, colon, lung, stomach, and esophagus. In addition, it is known that indole-3-carbinol produced by the glucosinolates also has an anticancer activity.

The glucosinolates may be a substance represented by the following chemical formula 1, and R may be various functional groups. R may be, for example, substituted or unsubstituted allyl, benzyl, or 2-phenylethyl group with from 1 to 10 carbon atoms.

Chemical formula 1

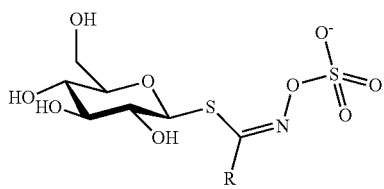

In the exemplary embodiment of the present disclosure, depending on the type of R, the glucosinolates may be glucoerucin, glucoraphenin, gluconapin, progoitrin, glucoraphanin, sinigrin, neoglucobrassicin, gluconasturtiin, glucoiberin, glucobrassicanapin, and the like.

The types of plants to which the light source according to an exemplary embodiment of the present disclosure is applied may vary. However, there may be differences in the photosynthetic efficiency of the light emitted from the light source or the degree of increase in the content of the active ingredients depending on the types of plants. The light source according to an exemplary embodiment of the present disclosure may be applied to a plant of the Brassicaceae family. In addition, the light source according to an exemplary embodiment of the present disclosure may be applied to a red radish, a red sango radish, a turnip, a cabbage, a broccoli, a rocket, an oilseed rape, a kohlrabi, a bok choy (Chinese cabbage), a red mustard, a tatsoi (Asia vitamin), a kale, and a red cabbage, which belongs to the Brassicaceae family. The types of plants according to an exemplary embodiment of the present disclosure should not be limited thereto or thereby, and the light source may be applied to other types of plants. Hereinafter, for the convenience of explanation, the light source applied to the plant of the Brassicaceae family will be described as a representative example.

Figure 1B:
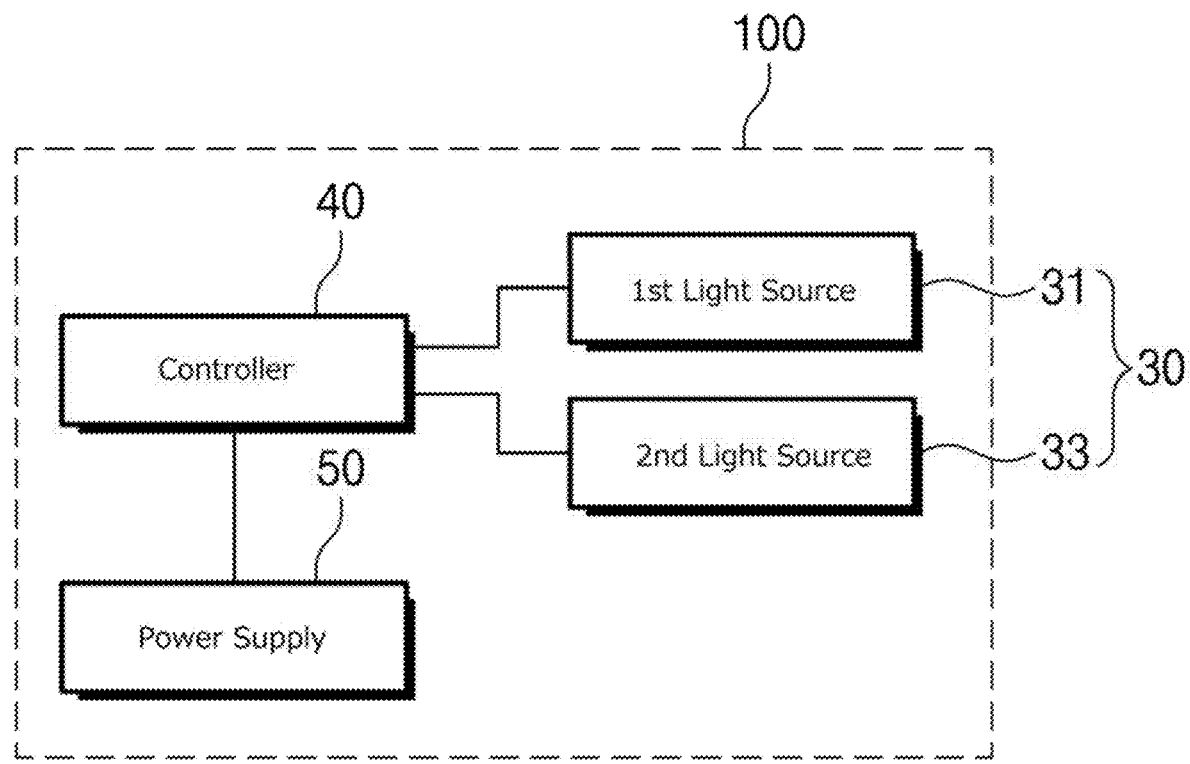
FIG. 1B is a block diagram showing a light source module for plant cultivation according to an exemplary embodiment of the present disclosure.
Figure 2:
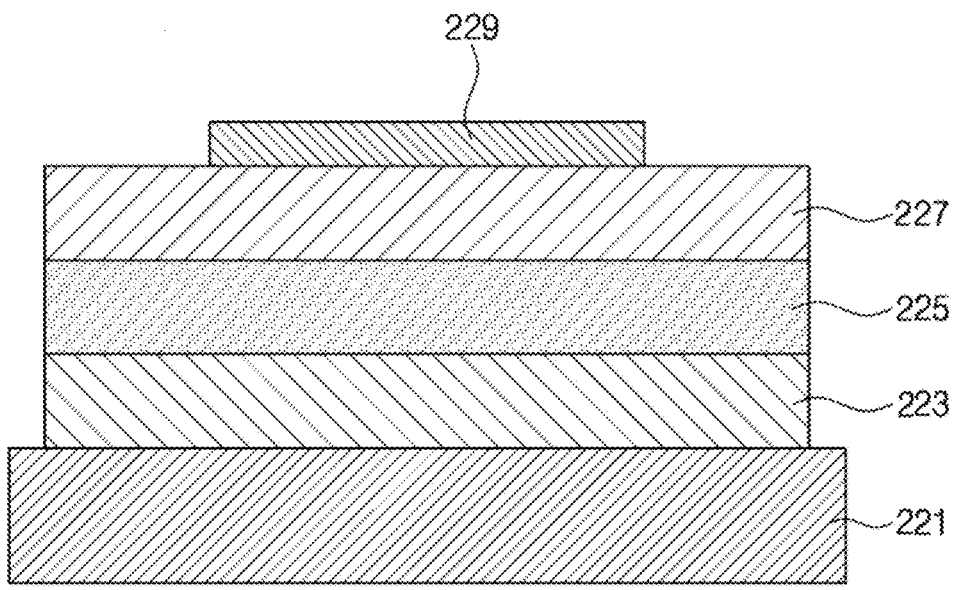
FIG. 2 is a cross-sectional view showing a light emitting device, according to an embodiment of the present disclosure.

FIG. 1A is a plan view showing a light source for plant cultivation according to an exemplary embodiment of the present disclosure. FIG. 1B is a block diagram of the light source of FIG. 1A. FIG. 2 is a block diagram showing a light source module for plant cultivation according to an exemplary embodiment of the present disclosure.

Referring to FIGS. 1 and 2, a plant cultivation light source module 100 includes a light source 30 emitting a light that plants need, a controller 40 controlling the light source 30, and a power supply 50 supplying a power to the light source 30 and/or the controller 40.

The light source 30 may include first and second light sources 31 and 33 having a spectrum peak in different wavelengths from each other. At least one of the first and second light sources 31 and 33 has the spectrum peak in a visible light wavelength band. Hereinafter, the first light source 31 having the spectrum peak in the visible light wavelength band will be described as a representative example.

The first light source 31 may emit the light in the visible light wavelength band. The light emitted from the first light source 31 may be a light having a wavelength band, which is mainly used in the process of plant photosynthesis, e.g., a light in the PAR spectral range.

In the present exemplary embodiment, the first light source 31 is shown as one component; however, the first light source 31 may be implemented as one or more light emitting diodes as long as the light emitting diodes emit the light in the visible light wavelength band that plants are able to use for photosynthesis. Alternatively, the first light source 31 may be implemented as one or more light emitting diodes as long as they emit the light having a predetermined spectrum described later. For example, the first light source 31 may include a light emitting diode that substantially simultaneously emits a blue color and a red color, or may include a light emitting diode emitting a light in a blue wavelength band and a plurality of light emitting diodes emitting a light in a red wavelength band.

The second light source 33 may emit a light having a wavelength band different from the first light source 31. For example, the second light source 33 may emit a light in an ultraviolet wavelength band, particularly, a light in ultraviolet-B wavelength band. The second light source 33 provides a light for the purpose of increasing the active ingredients in the plants. In addition, the second light source 33 may also include one or more light emitting diodes as needed.

The first light source 31 and the second light source 33 may be individually operated. Accordingly, only one light source among the first light source 31 and the second light source 33 may be turned on, or alternatively, both the first light source 31 and the second light source 33 may be turned on or turned off. In some embodiments, the first light source 31 and the second light source 33 may be individually turned on/off and may provide the light having the predetermined spectrum to the plants. The plants receive the light in various forms from the light source, i.e., the first and second light sources 31 and 33, depending on their growth stage, depending on whether it is a light period or a dark period, or depending on their harvesting time. The spectrum of the light emitted from the light source including the first and second light sources 31 and 33 will be described later.

The first light source 31 and the second light source 33 may be disposed on a substrate 20. The substrate 20 may be a printed circuit board on which wirings and circuits are formed to allow the first light source 31 and the second light source 33 to be directly mounted thereon, however, the substrate 20 should not be limited to the printed circuit board. The shape and the structure of the substrate 20 should not be particularly limited as long as the first light source 31 and the second light source 33 are mounted on the substrate, and the substrate 20 may be omitted. FIG. 2 is a cross-sectional view illustrating a light emitting diode, according to an embodiment of the present disclosure. However, the form of the light emitting diode is not limited thereto, but may be provided in various forms.

Referring to FIG. 2, the light emitting device may include a light emitting structure having a first semiconductor layer 223, an active layer 225, and a second semiconductor layer 227, and first and second electrodes 221 and 229 connected with the light emitting structure.

The first semiconductor layer 223 is a semiconductor layer doped with a first conductive-type dopant. The first conductive-type dopant may be a p-type dopant. The first conductive-type dopant may Mg, Zn, Ca, Sr, or Ba. In some embodiments, the first semiconductor layer 223 may include a nitride based semiconductor material. In other embodiments, the semiconductor material having the above composition formula may include GaN, AlN, AlGaN, InGaN, InN, InAlGaN, and AlInN.

The active layer 225 is provided on the first semiconductor layer 223 and corresponds to a light emitting layer. The active layer 225 is a layer which emits the light based on the band gap difference of the energy band resulting from the intrinsic material for the active layer 225 through the recombination of electrons (or holes) injected through the first semiconductor layer 223 and holes (or electrons) injected through the second semiconductor layer 227.

The active layer 225 may be implemented with a compound semiconductor. The active layer 225 may be implemented with at least one of a group III-V compound semiconductor or a group II-VI compound semiconductor.

The second semiconductor layer 227 is provided on the active layer 225. The second semiconductor layer 227 is a semiconductor layer doped with a second conductive-type dopant having a polarity opposite to that of the first conductive-type dopant. The second conductive-type dopant may be a n-type dopant, and the second conductive-type dopant may include, for example, Si, Ge, Se, Te, O, or C.

In some embodiments, the second semiconductor layer 227 may include a nitride based semiconductor material. In other embodiments, the semiconductor material having the composition formula may include GaN, AlN, AlGaN, InGaN, InN, InAlGaN, or AlInN.

In some embodiments, the first electrode 221 and the second electrode 229 are provided in various shapes to connect with the first semiconductor layer 223 and the second semiconductor layer 227, respectively. The first electrode 221 is provided under the first semiconductor layer 223 and the second electrode 229 is provided on the second semiconductor layer, but the light emitting structure of FIG. 2 is not limited thereto. In some embodiments, the first and second electrodes 221 and 229 include Al, Ti, Cr, Ni, Au, Ag, Ti, Sn, Ni, Cr, W, Cu, or a combination thereof. The first and second electrodes 221 and 229 are formed of a single layer structure, or a multi-layer structure.

In some embodiments, a vertical type light emitting diode is explained, but it is not limited thereto. The light emitting diode does not necessarily have to be a vertical type and other types are available.

According to some embodiments, the following effects may be obtained by using a light emitting diode instead of an existing typical lamp as a light source to apply light to a test sample.

In some embodiments, when the light emitting diode is used as the light source, light having a specific wavelength may be provided to an irradiation target, as compared to light emitted from the existing typical lamp (for example, an existing UV lamp). The light emitted from the existing lamp has a broader spectrum in a wider area as compared to the light emitted from the light emitting diode. Accordingly, in the case of the existing UV lamp, it is not easy to separate only light having some band of the wavelength band of the emitted light. In contrast, the light emitted from the light emitting diode has a sharp peak at a specific wavelength and provides light of a specific wavelength having a very small half-width as comparison to light from an existing lamp. Accordingly, it is easy to select light of a specific wavelength and only the selected light of the specific wavelength may be provided to the target sample.

In addition, in the case of the existing lamp, although light is provided to the test sample, it may be difficult to precisely limit an amount of light. However, in the case of the light emitting diode, light may be provided by exactly limiting the amount of light. Further, in the case of the existing lamp, since it may be difficult to precisely limit the amount of light, the irradiation time may also be set in a wide range. However, in the case of the light emitting diode, light necessary for the test sample may be provided within a definite time for a relatively short time.

As described above, in the case of the conventional lamp, it is difficult to clearly determine the light irradiation amount due to the relatively wide range of wavelengths, the wide range of light quantity, and the wide range of irradiation time. To the contrary, the light emitting diode can provide a clear light irradiation amount due to a relatively narrow range of wavelengths, a narrow amount of light, and a narrow range of irradiation time.

In addition, in the case of the existing lamp, it takes longer time to arrive at the maximum amount of light after power is turned on. To the contrary, when the light emitting diode is used, an amount of light instantly arrives at the maximum amount of light since warming-up time is hardly taken after the power is turned on. Therefore, in the case of a light source employing the light emitting diode, the irradiation time of the light may be clearly controlled when irradiating light of a specific wavelength to an optical element target.

Referring to FIG. 1B, the controller 40 is connected to the first light source 31 and the second light source 33 to control whether to operate or not the first light source 31 and the second light source 33. The controller 40 may be connected to the first and/or second light sources 31 and 33 via a wired connection or wirelessly. The controller 40 is connected to the power supply 50 that supplies the power to the controller 40. The power supply 50 may be connected to the light source via the controller 40 or may be directly connected to the light source to supply the power to the light source.

The controller 40 may control ON/OFF of the first light source 31 and/or the second light source 33 such that the first light source 31 and/or the second light source 33 emit the lights at a predetermined intensity for a predetermine period. The first light source 31 and the second light source 33 may be individually operated such that the plants carry out photosynthesis with a maximum efficiency. The controller 40 may independently control an emission intensity or an emission time of the lights from the first light source 31 and the second light source 33. In addition, when the first light source 31 and/or the second light source 33 include the plural light emitting diodes, the individual light emitting diodes may be independently controlled.

The controller 40 may control the operation of the first light source 31 and the second light source 33 according to a preset process or according to a user's input. The operation of the first light source 31 and the second light source 33 may be changed in various ways depending on the type of plants and the growth stage of the plants.

Figure 3A:
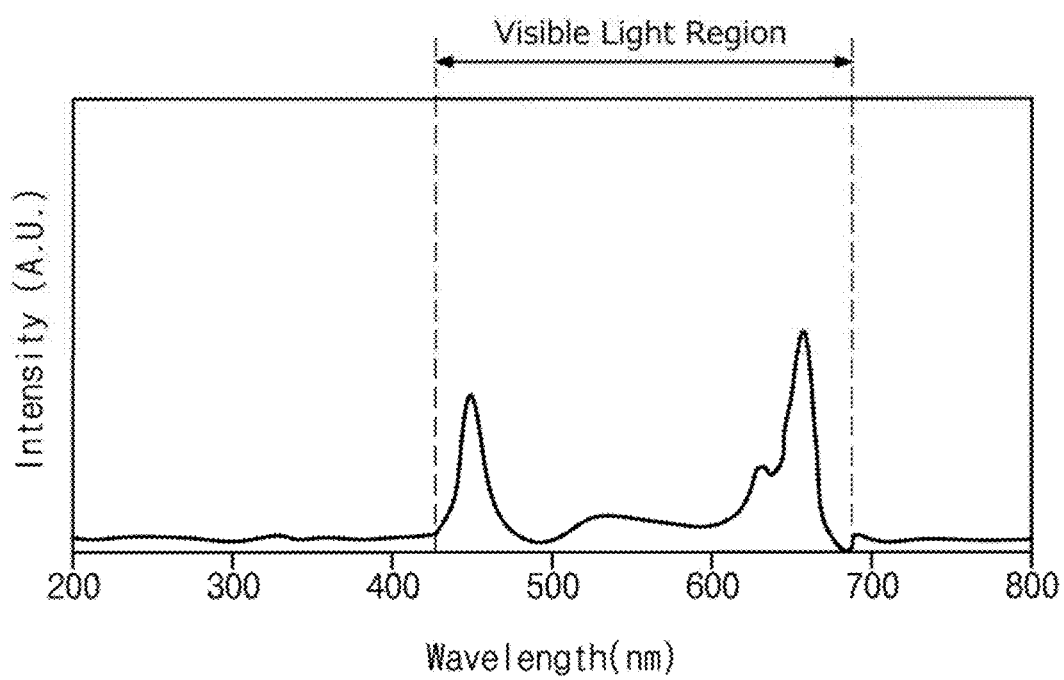
FIG. 3A is a graph showing a spectrum of a light emitted from a light source before transplanting plants according to an exemplary embodiment of the present disclosure.
Figure 3B:
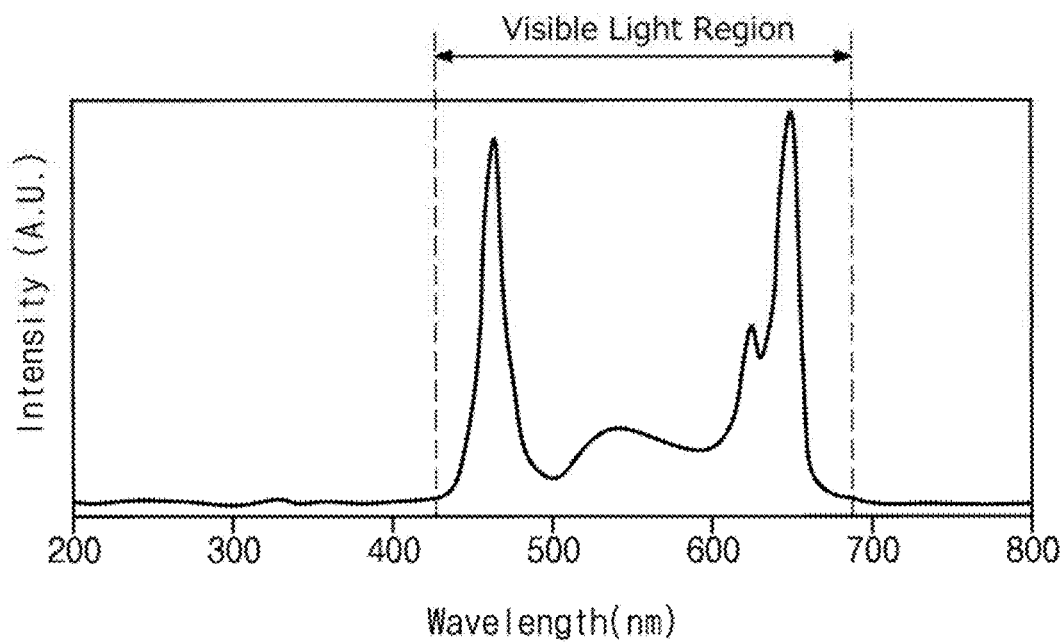
FIG. 3B is a graph showing a spectrum of a light emitted from a light source after transplanting plants according to an exemplary embodiment of the present disclosure.
Figure 3C:
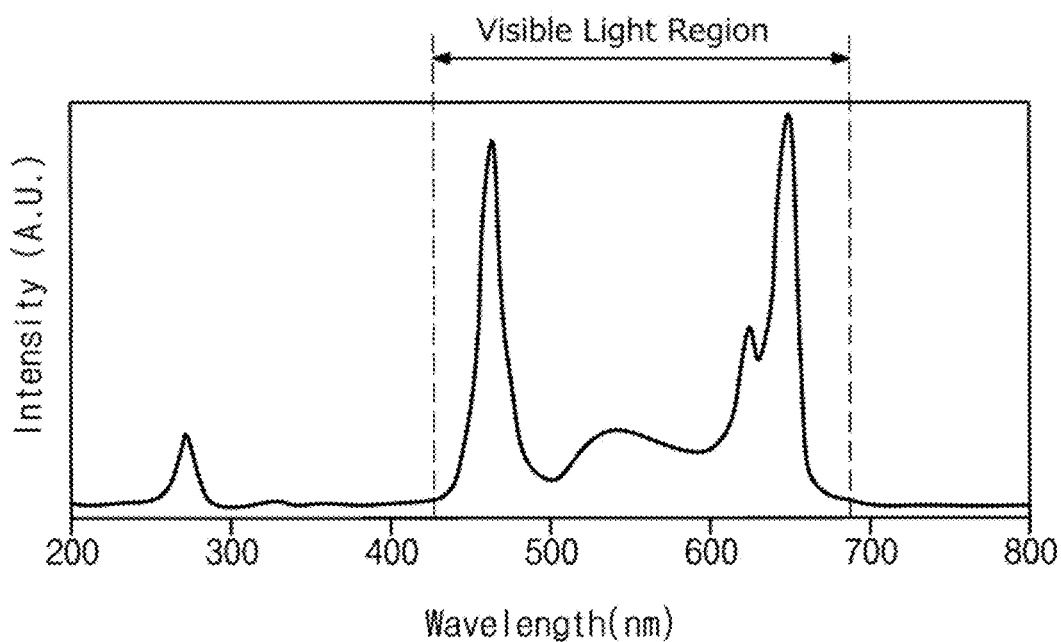
FIG. 3C is a graph showing a spectrum of a light emitted from a light source in another predetermined period different from the period of FIG. 3B according to an exemplary embodiment of the present disclosure.

FIGS. 3A to 3C are graphs showing a spectrum of a light emitted from a light source according to an exemplary embodiment of the present disclosure.

The light source according to the exemplary embodiment of the present disclosure may emit lights having different wavelength bands from each other depending on the growth stage of the plants. FIG. 3A shows the spectrum of the light in a predetermined period before transplanting the plants and after sowing seeds, FIG. 3B shows the spectrum of the light in a predetermined period after transplanting the plants, and FIG. 3C shows the spectrum of the light in another predetermined period different from the predetermined period of FIG. 3B after transplanting the plants.

In the exemplary embodiment of the present disclosure, the seeds of the plants may be germinated during the dark period after being sowed. For the germination of the seeds, the dark period may be maintained for about 1.5 days to about 3 days, for example, for about 24 hours after the sowing of the seeds, and only purified water may be provided to the seeds without a separate nutrient solution.

The germinated seeds may grow to sprouts under the light period and the dark period, and the sprouts may be transplanted into a cultivating device after a predetermined time elapses. The germinated seeds may be under the light period and the dark period for about 5 days to about 9 days, for example, about 7 days, to grow as the sprouts, and the sprouts may be transplanted into the cultivating device. The sprouts transplanted into the cultivating device may grow into adult plants using the nutrient solution.

The light period and the dark period may be variously set depending on the types of plants and, for example, may be alternately repeated on a 24-hour basis. For example, the dark period may be maintained for about 6 hours to about 10 hours, the light period may be maintained for about 18 hours to about 14 hours, and the dark period and the light period may be repeated on the 24-hour basis. A light intensity in the light period may be within a range from about 50 to about 80 µmol/m$^2$/s (PPFD), preferably, about 69.8 µmol/m$^2$/s.

In some embodiments, after the seeds are germinated, a light in a wavelength band that enables the photosynthesis is provided in the light period until the germinated seeds grow into the sprouts before being transplanted. The spectrum of the light provided to the germinated seeds until the germinated seeds grow into the sprouts before being transplanted is as shown in FIG. 3A.

Referring to FIG. 3A, the light source may provide a light having a spectrum curve where a peak appears in a full width at half maximum that is narrow at a predetermined wavelength rather than emitting a light with a spectrum curve having a peak in a full width at half maximum that is substantially the same in the entire wavelength band. For example, the light source may have the peak having the narrow full width at half maximum and a relatively high intensity at about 660 nanometers and about 450 nanometers. The peaks at about 660 nanometers and about 450 nanometers respectively correspond to red color and blue color.

In the exemplary embodiment of the present disclosure, after being transplanted, the plants may grow into the adult plants under the light period and the dark period until they are harvested. It may take approximately about 18 days to about 23 days from the transplanting to the harvesting, and as an example, the plants may be harvested after being cultivated for about 21 days (e.g., cultivating for about 30 days after sowing). The light period and the dark period may be variously set depending on the types of plants and, for example, may be alternately repeated on a 24-hour basis. For example, the dark period may be maintained for about 6 hours to about 10 hours, the light period may be maintained for about 18 hours to about 14 hours, and the dark period and the light period may be repeated on the 24-hour basis. The light intensity in the light period may be within a range from about 50 to about 80 µmol/m$^2$/s (PPFD), preferably, about 69.8 µmol/m$^2$/s.

In some embodiments, a light having the spectrum shown in FIGS. 3B and 3C may be irradiated to the plants in the light period after the transplanting. The light having the spectrum shown in FIG. 3B may be implemented by turning on only the first light source, and the light having the spectrum shown in FIG. 3C may be implemented by turning on both the first light source and the second light source described above.

The lights shown in FIGS. 3B and 3C are provided during different periods from each other. Here, the term "period" means a temporal period. For example, the light corresponding to FIG. 3B may be provided during a portion of the period, and the light corresponding to FIG. 3C may be provided during the other portion of the period except for the portion of the period. Hereinafter, for the convenience of explanation, the period in which the light corresponding to FIG. 3B is provided will be referred to as a "first period", and the period in which the light corresponding to FIG. 3C is provided will be referred to as a "second period". In other words, only the above-described first light source may be turned on in the first period, and both the first light source and the second light source may be turned on in the second period.

In some embodiments, the first period or the second period are periods in which the light having the visible light wavelength band is provided and corresponds to a predetermined period in the light period. In some embodiments, the second period is shorter than the first period.

Referring to FIG. 3B, the light source may provide a light having a spectrum curve where a peak appears in a full width at half maximum that is narrow at a predetermined wavelength during the first period rather than emitting a light with a spectrum curve having a peak in a full width at half maximum that is substantially the same in the entire wavelength band. For example, the light source may have the peak having the narrow full width at half maximum and a relatively high intensity at about 660 nanometers and about 450 nanometers, which are mainly used for the photosynthesis. The peaks at about 660 nanometers and about 450 nanometers, respectively correspond to the red color and the blue color. In addition to the peaks respectively corresponding to the red and blue colors, a plurality of peaks having a lower height than the peaks respectively corresponding to the red and blue colors may be further provided. In some embodiments, as shown in FIGS. 3A and 3B, the light corresponding to before the transplanting and the light corresponding to the first period after the transplanting may have the same spectrum or may have substantially similar spectrum, if not identical. However, the light corresponding to before the transplanting and the light corresponding to the first period after the transplanting may have different intensities from each other. For example, the intensity of light provided to the plant after transplanting may be higher than that of before transplanting. By way of example, the light intensity in the light period may be within a range from about 50 to about 80 μmol/m²/s (PPFD), preferably, about 69.8 μmol/m²/s.

Referring to FIG. 3C, the light source has a spectrum similar to the light provided in the first period in some wavelength bands during the second period and has a different spectrum from the light provided in the first period in the other wavelength bands. In this case, the light source may provide a light having a spectrum curve with a peak appearing in a full width at half maximum that is narrow at a predetermined wavelength during the second period rather than emitting a light having a spectrum curve with a peak appearing in a full width at half maximum that is substantially the same in the entire wavelength band. For example, the light source may have the peak having the narrow full width at half maximum and a relatively high intensity at about 660 nanometers and about 450 nanometers, which are mainly used for the photosynthesis. Further, the spectrum of the light source has a relatively higher peak in the wavelength band other than the visible light, for example, in the ultraviolet wavelength band. In some embodiments, the spectrum of the light source has a peak with a narrow full width at half maximum at a wavelength band of about 300 nm or less. The spectrum of the light source may have a peak with a narrow full width at half maximum at a wavelength band of from about 280 to about 295. In the second period, the light source may have the same spectrum as in the first period in the visible light wavelength band. That is, the light in the visible light wavelength band may be provided without being changed, and the light in the wavelength band other than the visible light, for example, the ultraviolet wavelength band (e.g., the wavelength band of ultraviolet B) may be added.

The spectrum of the light source in each of the first period and the second period may be implemented by driving the light source shown in FIG. 1B. In particular, the spectrum may be implemented by independently or selectively turning on or turning off the first light source and the second light source. For example, although the light source shown in FIGS. 1A and 1B is used, only the first light source may be turned on during the first period. In the case where the first light source is turned on, the light source may emit the light in the visible light wavelength band, for example, the light having the spectrum shown in FIG. 3B. In the second period, the first light source and the second light source may be turned on. In the case where the first and second light sources are turned on, the light source may emit the light in the visible light wavelength band and the light in the ultraviolet wavelength band, for example, the light having the spectrum shown in FIG. 3C.

In other embodiments, the first period and the second period may be arranged in various ways depending on the growth stage and the harvest time of the plants. For example, the first period may be arranged before the harvesting of the plants after the plants are transplanted. The second period may be arranged adjacent to the first period and may be arranged right before the harvesting time within an overall schedule. In other words, the first period may be continued after the transplanting of the plants, and the second period may be arranged at a time other than the first period right before harvesting. Then, the plants are harvested. Alternatively, the second period may be arranged between the first periods over one to three days right before harvesting.

In some embodiments, the plants may be cultivated under the light period and the dark period, which are alternated for about 20 days after the transplanting of the plants, and in this case, the light period may correspond to the first period. Then, the first period and the second period may be sequentially provided or the second period and the first period may be sequentially provided in the light period of the 21st day after the transplanting. In the case where the light period of the 21st day after the transplanting is about 16 hours, the first period may be maintained for about 13 hours, and the second period may be maintained for about 3 hours. To the contrary, the second period may be maintained for about 3 hours, and the first period may be maintained for about 13 hours.

This may be explained as follows. In some embodiments, the light source may be turned on or turned off depending on the light period and the dark period and may be used for plant cultivation. The light source for plant cultivation is turned on during the light period and emits the light having the spectrum with the plural peaks to the plants. The light emitted from the light source includes the light having the wavelength band to increase a content of a predetermined substance in the plants.

At least one of the peaks of the light emitted in the second period of the light period is not provided in the first period preceding or following the second period. That is, the light corresponding to the ultraviolet wavelength band, for example, the wavelength band equal to or smaller than about 300 nm, is provided in the second period but not provided in the first period. By way of example, the at least one peak provided in the second period but not provided in the first period may have a wavelength of from about 280 to about 295.

The other peaks except for the at least one peak, which is provided in the second period but not provided in the first period, may be located in the visible light wavelength band and may be provided both in the second period and the first period. The other peaks except for the at least one peak, which is provided in the second period but not provided in the first period, may include peaks provided in each of a blue wavelength band and a red wavelength band. The other peaks except for the at least one peak, which is provided in the second period but not provided in the first period, may appear at substantially the same wavelength as each other.

In some embodiments, the second period may be arranged right before the harvesting of the plants and may be provided in less than about 6 hours. For example, the second period may be provided for about 3 hours. The light provided to the plants during the second period is a continuous light.

In some embodiments, the light source may have the structure as shown in FIGS. 1 and 2 to provide the above-described light to the plants. The light source may include a plurality of light emitting diodes that emits lights having different wavelengths from each other, and the light emitting diodes may be combined with each other in various forms to emit the light having the spectrum of the above type. For example, each of the first light source and the second light source shown in FIG. 1 may each independently include one or more light emitting diodes.

When the light source for plant cultivation is used, it is possible to independently provide a growing environment suitable for the types of plants even under conditions in which the sunlight is insufficient or the sunlight is not provided. In addition, plants having a high content of active ingredient may be easily grown.

EXAMPLES

1. Growth Conditions and Light Treatment Conditions for Plants

In the following examples, experiments were carried out on kale, which belongs to the Brassicaceae family, among plants as a representative example. The kale was grown for a total of 31 days and harvested on the 32nd day. The growth conditions of the kale according to an experimental example are shown in FIG. 4. Hereinafter, in drawings, for the convenience of explanation, a period during which the light corresponding to FIG. 3B is irradiated is shown as the first period, a period during which the light corresponding to FIG. 3C is irradiated is shown as the second period, and other features are described separately.

With reference to FIG. 4, a control group will be described first. The kale was germinated in the dark period for about 2 days after being sowed. In other words, kale seeds were first sowed into a cultivation sponge and germinated in the dark period for about 2 days to grow the kale.

The kale was grown in the light period and the dark period from day 3 to day 9 after sowing, and this corresponds to an irradiation period before transplanting. The light having the spectrum shown in FIG. 3A was irradiated to the kale in the light period at a light intensity of about 69.8 umol/m$^2$/s PPFD (Photosynthetic Photon Flux Density). Only the purified water was provided to the plants after sowing and before transplanting.

The grown sprouts were transplanted in a deep-flow technique (DFT) hydroponic culture system on the 10th day. The transplanted kale was grown in nutrient solution under the light and dark periods. As the nutrient solution, Hoagland stock solution was used, and the pH of the nutrient solution was maintained at about 5.5 to about 6.5. After the transplanting, the light period and the dark period were provided on the 24-hour basis for about 21 days. On the 24-hour basis, the light period was maintained for about 16 hours, and the dark period was maintained for about 8 hours. The light having the spectrum shown in FIG. 3B was irradiated to the kale in the light period at a light intensity of about 152.8 umol/m$^2$/s PPFD (Photosynthetic Photon Flux Density).

Control group 1 was irradiated with the light corresponding to FIG. 3B in the light period till the 30th day from the date of transplanting. Treatment group 1 was irradiated with the light under the same condition as the control group till the 29th day from the date of transplanting. However, treatment group 1 was irradiated with the light having the spectra shown in FIGS. 3B and 3C in the light period under a certain condition on the 30th day from the date of transplanting.

Treatment group 2 was irradiated with the light under the same condition as the control group till the 28th day from the date of transplanting. However, treatment group 2 was irradiated with the light having the spectra shown in FIGS. 3B and 3C in the light period under a certain condition on the 29th and 30th days from the date of transplanting. In this case, the light having the spectrum shown in FIG. 3C was continuously irradiated during the light period of about 16 hours each for two days.

Treatment group 3 was irradiated with the light under the same condition as the control group till the 27th day from the date of transplanting. However, treatment group 3 was irradiated with the light having the spectra shown in FIGS. 3B and 3C in the light period under a certain condition on the 28th to 30th days from the date of transplanting. In this case, the light having the spectrum shown in FIG. 3C was irradiated in an on and off manner for a predetermined period. As an example, the irradiation of the light having the spectrum shown in FIG. 3C was repeated over a period of about 3 days in a 16-hour light period in a manner in which a 5-minute irradiation is followed by a 75-minute non-irradiation until the end of the light period.

2. Comparison of Active Ingredient Content by Irradiation with UVA and UVB

In the present experiment, effects on the plants, which are caused by the light irradiation of the light source in the second period, were observed. The light irradiated in the second period in the present experiment has substantially the same spectrum as that of FIG. 3B in the visible light wavelength band; however, the light irradiated in the second period in the present experiment has the spectra respectively corresponding to the ultraviolet ray A (UVA) and the ultraviolet ray B (UVB) in the ultraviolet wavelength band.

FIG. 5 shows experimental conditions in the present exemplary embodiment, and the experimental conditions correspond to the control group and treatment group 2 of FIG. 4. In detail, in FIG. 5, comparative example 1 corresponds to the control group of FIG. 4, and the dark period and the light period were respectively maintained during about 8 hours and about 16 hours for last two days before harvesting. Each of experimental example 1 and experimental example 2 corresponds to treatment group 2 of FIG. 4. However, a light irradiated in experimental example 1 corresponds to the light having the peak corresponding to the UVB in the ultraviolet wavelength band of the spectrum shown in FIG. 3C, and a light irradiated in experimental example 2 corresponds to the light having the peak corresponding to the UVA in the ultraviolet wavelength band of the spectrum shown in FIG. 3C. The UVA and the UVB were set to have different light intensities such that total energy amounts were equal to each other. In the present exemplary embodiment, the total energy amount and the light intensity of the UVA and the UVB were values corresponding to the ultraviolet wavelength band except the visible light, the UVB was supplied at a total energy amount of about 11.52 kJ/m$^2$ and a light intensity of about 10 uW/cm$^2$, and the UVA was supplied at a total energy amount of about 1,152 kJ/m$^2$ and a light intensity of about 1000 uW/cm$^2$.

Figure 6A:
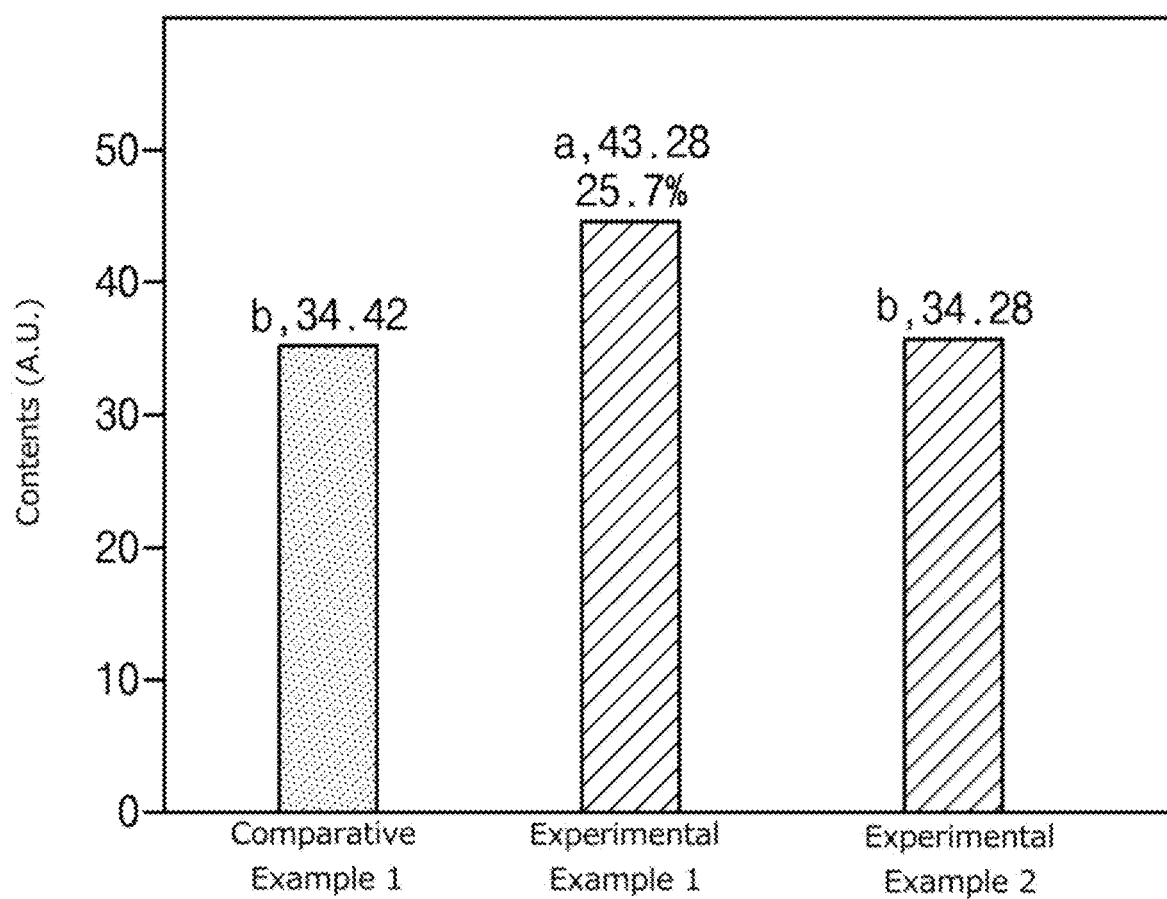
FIG. 6A is a graph sequentially showing contents of chlorophylls, contained in kale harvested on the 31st day after the date of sowing, after the light treatment was performed in comparative example 1, experimental example 1, and experimental example 2.
Figure 6B:
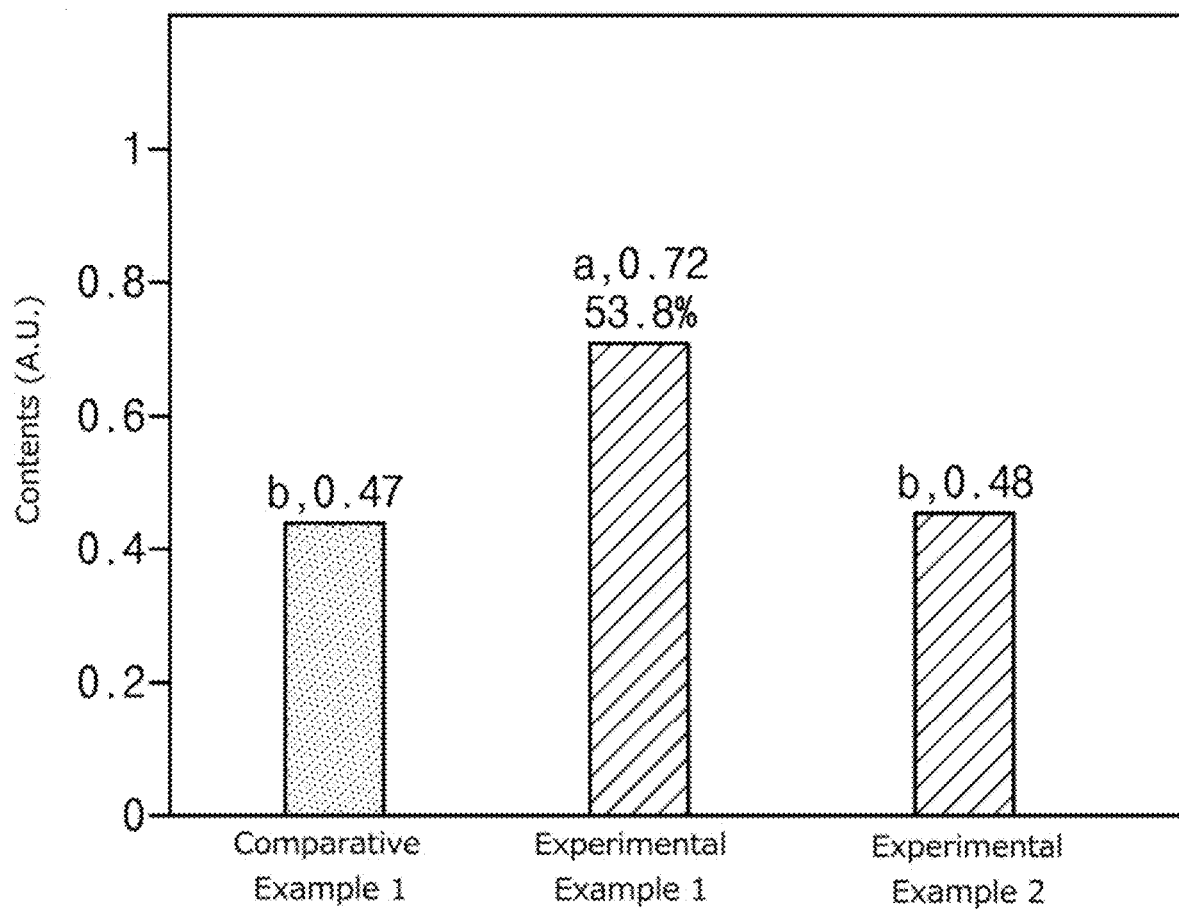
FIG. 6B is a graph sequentially showing contents of flavonols contained in kale harvested on the 31st day after the date of sowing, after the light treatment was performed in comparative example 1, experimental example 1, and experimental example 2.

FIGS. 6A to 6C are graphs sequentially showing contents of chlorophylls, flavonols, and anthocyanins contained in the kale harvested on the 31st day after the date of sowing, after the light treatment was performed under the above conditions.

Referring to FIGS. 6A to 6C, when the UVA and the UVB were applied to the plants, both the UVA and UVB irradiation increased the content of active ingredients in the plants. However, even though the UVA and the UVB were provided to the plants at the same energy, the content of the active ingredients was significantly higher when the UVB was provided to the plants than when the UVA was provided to the plants.

Accordingly, it was found that the use of UVB as the light was more advantageous to increase the content of the active ingredients among the UVA and the UVB, and hereinafter, the content of the active ingredients and the damage of the plants were examined based on the UVB.

3. Comparison of Damage to Plants and Active Ingredient Content of Plants Due to Irradiation Dose of UVB In the present experiment, the damage on the plants depending on an irradiation time was observed. A light used in the second period of the present experiment has a peak corresponding to the UVB and the visible light wavelength band and has substantially the same spectrum of FIG. 3C.

FIG. 7 shows experimental conditions in the present exemplary embodiment, and the experimental conditions correspond to the control group and treatment group 1 of FIG. 4. In detail, in FIG. 7, comparative example 2 corresponds to the control group of FIG. 4, and the dark period and the light period were respectively maintained during about 8 hours and about 16 hours for last two days before harvesting. Each of experimental example 3 and experimental example 4 corresponds to treatment group 1 of FIG. 4. However, in experimental example 3, the light shown in FIG. 3C was irradiated in the light period for about 3 hours, and in experimental example 4, the light shown in FIG. 3C was irradiated in the light period for about 6 hours. The total energy amount is a value corresponding to the ultraviolet wavelength band except the visible light. In the present exemplary embodiment, the total energy amount of the UVB in experimental example 3 was about 1.08 kJ/m$^2$, and the total energy amount of the UVB in experimental example 4 was about 2.16 kJ/m$^2$.

Figure 8A:
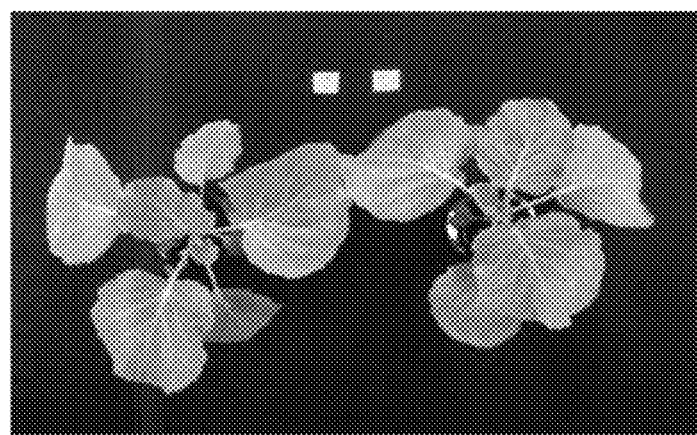
FIG. 8A is a photograph showing experimental result of comparative example 3.
Figure 8B:
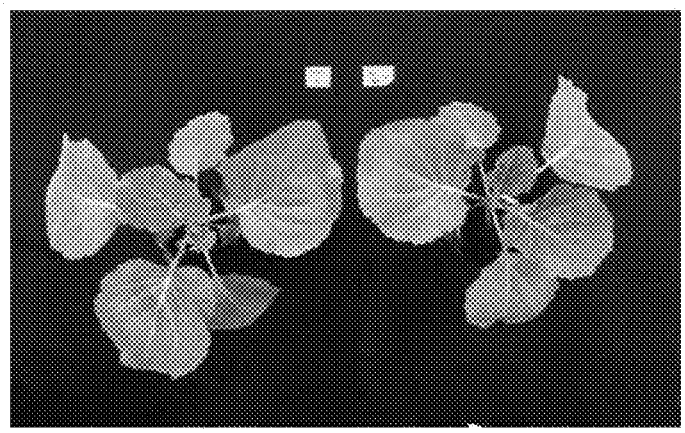
FIG. 8B is a photograph showing experimental results of experimental example 4.
Figure 8C:
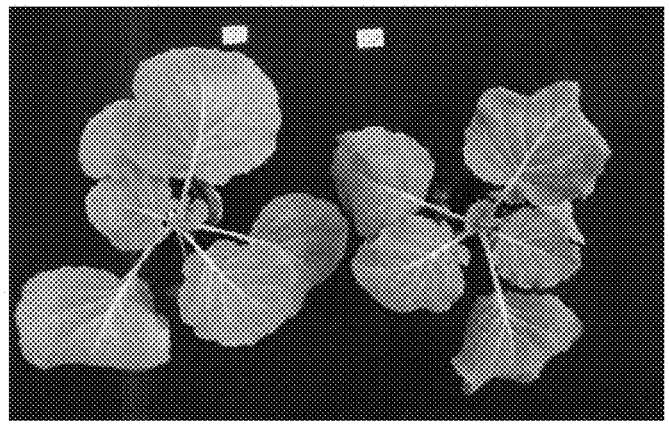
FIG. 8C is another photograph showing experimental result of experimental example 3.
Figure 8D:
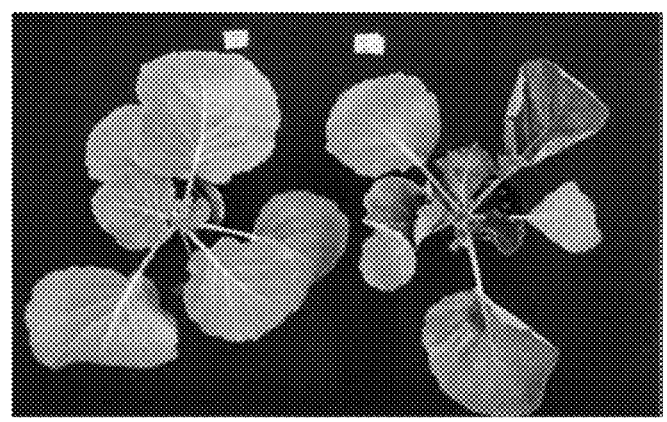
FIG. 8D is another photograph showing experimental result of experimental example 4.

FIGS. 8A to 8D are photographs showing experimental results of comparative example 2, experimental example 3, and experimental example 4. In FIGS. 8A to 8D, the kale on the left side in each photograph corresponds to the control group. The photograph on the right side of FIG. 8A is a photograph of the kale at a point in time where one day has elapsed after the light was applied according to the light condition described in experimental example 3, and the photograph on the right side of FIG. 8B is a photograph of the kale at a point in time where one day has elapsed after the light was applied according to the light condition described in experimental example 4. The photograph on the right side of FIG. 8C is a photograph of the kale at a point in time where 4 days have elapsed after the light was applied according to the light condition described in experimental example 3, and the photograph on the right side of FIG. 8D is a photograph of the kale at a point in time where 4 days have elapsed after the light was applied according to the light condition described in experimental example 4.

Referring to FIGS. 8A to 8D, when the light corresponding to the UVB was applied for about 3 hours, the damage of the plants was not observed at a time point where one day has elapsed; however, leaf curling and browning phenomena were observed in the kale applied with the light for about 6 hours at a time point where 4 days have elapsed. As a result, it was found that the UVB causes the damage to the plants when being applied for a predetermined time or more, for example, for about 6 hours or more.

Figure 9A:
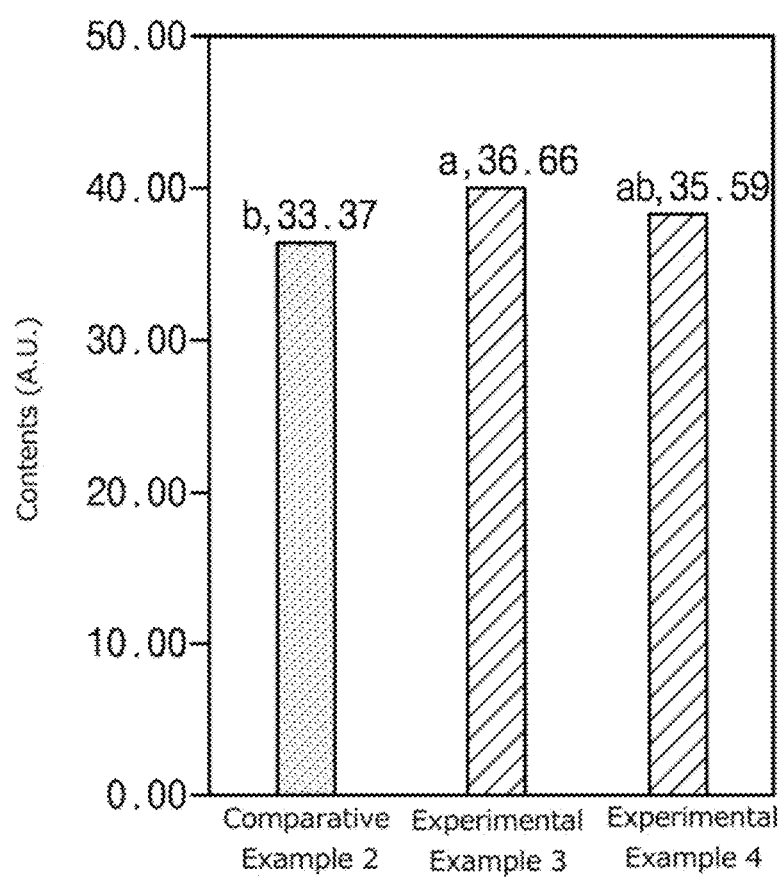
FIG. 9A is a graph sequentially showing contents of chlorophylls contained in kale harvested on the 31st day after the date of sowing in comparative example 2, experimental example 3 and experimental example 4.
Figure 9B:
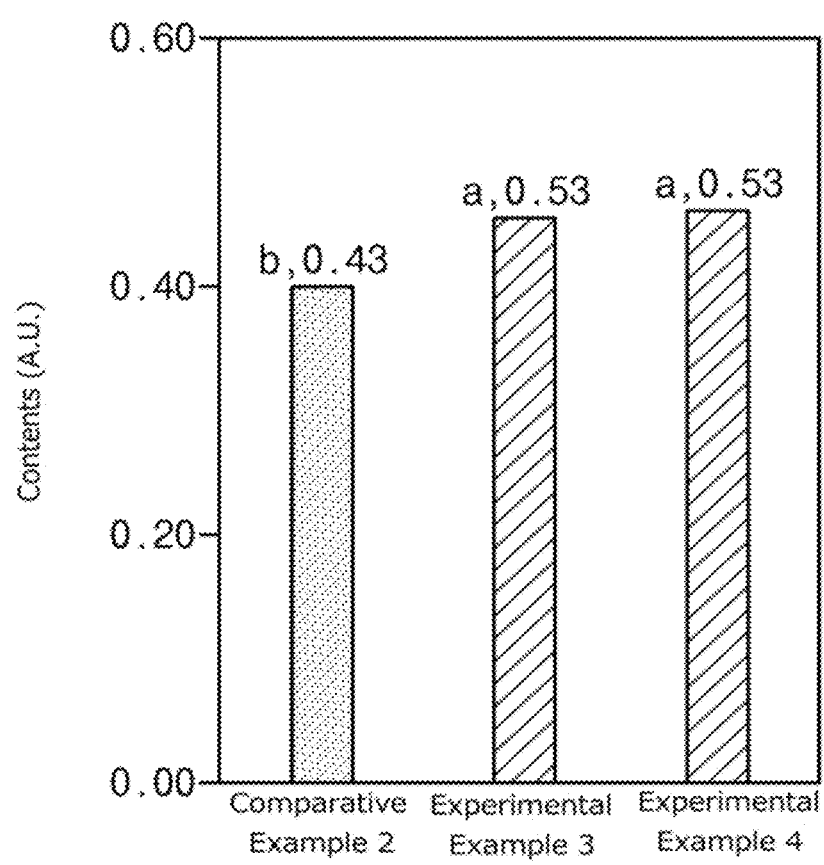
FIG. 9B is a graph sequentially showing contents of flavonols contained in kale harvested on the 31st day after the date of sowing in comparative example 2, experimental example 3 and experimental example 4.

FIGS. 9A to 9C are graphs sequentially showing contents of chlorophylls, flavonols, and anthocyanins contained in the kale harvested on the 31st day after the date of sowing in comparative example 2, experimental example 3, and experimental example 4.

Referring to FIGS. 9A to 9C, when the UVB is applied to the plants, the active ingredients were at least maintained or the content of the active ingredients was increased. However, the tendency for the increase and the maintenance of the active ingredients depending on time of UVB irradiation was not directly observed to a meaningful extent. For example, in the case of chlorophylls, the content of chlorophylls of experimental example 3 was significantly increased as compared with that of the control group, but, different from experimental example 3, in the case of experimental example 4, it is difficult to determine that the content of chlorophylls was significantly increased as compared with that of the control group. In the case of flavonols, the content of flavonols in experimental examples 3 and 4 was significantly increased as compared with the control group. However, in the case of anthocyanins, there was no significant change in experimental example 3 as compared with the control group, and the content of anthocyanins was significantly increased in experimental example 4.

Through this experiment, when the plants are exposed to the UVB for about 6 hours or more to receive the energy of about 2.16 kJ/m$^2$, it was observed that the plants may be damaged from irradiation of light.

4. Comparison of Damage to Plants and Active Ingredient Content of Plants Depending on Continuous Irradiation or On and Off Irradiation of UVB In the present experiment, influences on the plants depending on a continuous irradiation method or an on and off irradiation method of the light source were observed.

FIG. 10 shows experimental conditions in the present exemplary embodiment and corresponds to the control group and treatment group 3 of FIG. 4. In detail, in FIG. 10, comparative example 3 corresponds to the control group of FIG. 4, and the dark period and the light period were respectively maintained during about 8 hours and about 16 hours for last two days before harvesting. Each of experimental example 5 and experimental example 6 corresponds to treatment group 3 of FIG. 4. However, in experimental example 5, the light having the spectrum shown in FIG. 3C was irradiated in the light period for about 3 hours, and the light having the spectrum shown in FIG. 3B was irradiated in the light period for about 13 hours. The light irradiation in the above-described method was repeated for about 3 days. In experimental example 6, the light having the spectrum shown in FIG. 3C was provided for about 3 hours in the light period, and the irradiation method in which the 5-minute irradiation is followed by the 75-minute non-irradiation was repeated until the end of the light period in the light period of about 16 hours. The light irradiation method described above was repeated for about 3 days. Therefore, a total time during which the light is applied in experimental example 5 is substantially the same as that in experimental example 6, and a total energy applied in experimental example 5 is substantially the same as that in experimental example 6. The total energy amount was a value corresponding to the ultraviolet wavelength band except the visible light. In the present exemplary embodiment, the total energy amount of the UVB in experimental examples 5 and 6 was about 1.08 kJ/m$^2$.

Figure 11A:
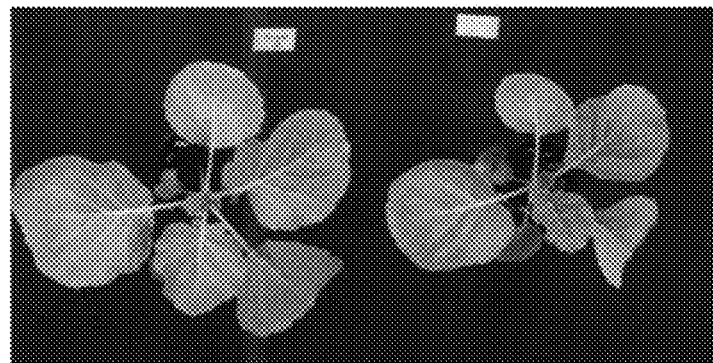
FIG. 11A is a photograph showing experimental result of experimental example 5.
Figure 11B:
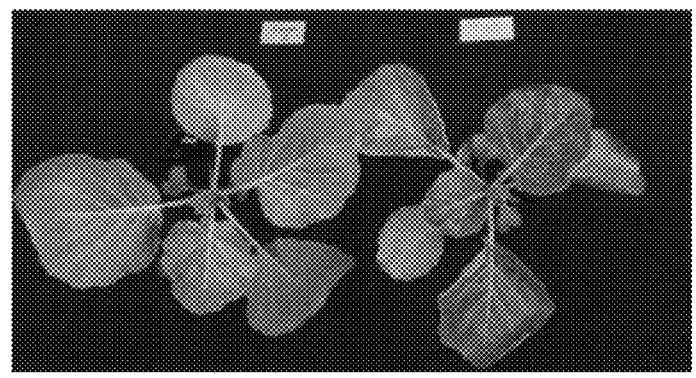
FIG. 11B is a photograph showing experimental result of experimental example 6.

FIGS. 11A and 11B are photographs showing experimental results of comparative example 3, experimental example 5, and experimental example 6. In FIGS. 11A and 11B, the kale on the left side in each photograph corresponds to the control group. The photograph on the right side of FIG. 11A is a photograph of the kale at a point in time where the kale was harvested when the light has been applied according to the light condition described in experimental example 5. The photograph on the right side of FIG. 11B is a photograph of the kale at a point in time where the kale was harvested when the light has been applied according to the light condition described in experimental example 6.

Referring to FIGS. 11A and 11B, there was almost no damage on the kale in experimental example 5 in which the light was continuously irradiated for about 3 hours. However, in the case of experimental example 6 in which the light was irradiated for about 3 hours in a flickering manner, leaf curling phenomenon in the kale was observed, and a few color changes were also observed. Through this, it was found that the continuous irradiation of the UVB was safer to the plants than the irradiation of the UVB in the on and off manner.

Figure 12A:
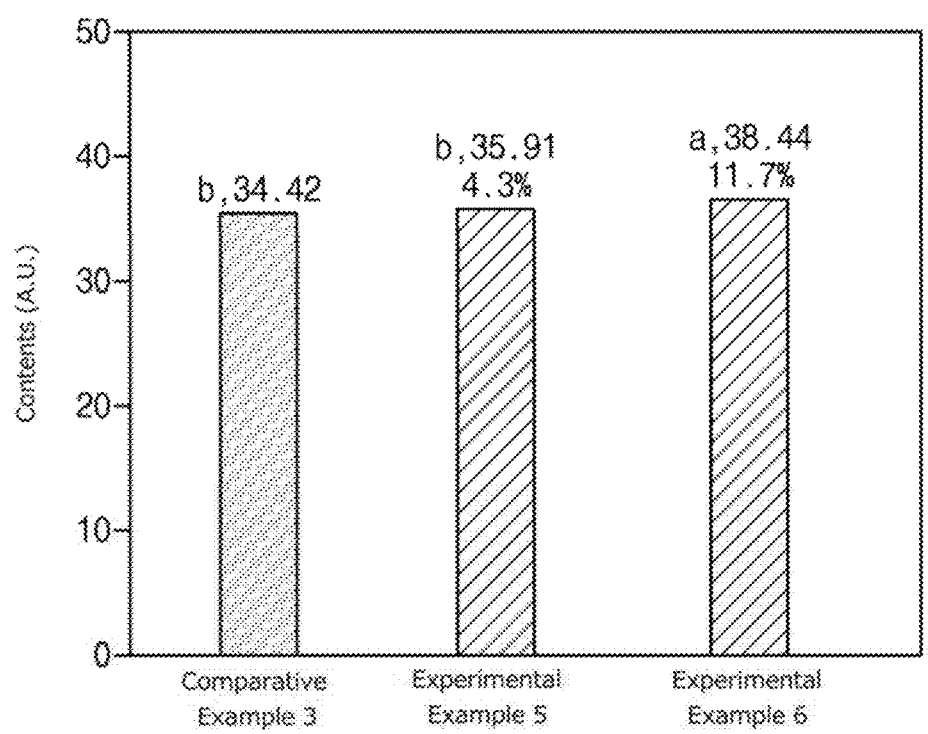
FIG. 12A is a graph sequentially showing contents of chlorophylls contained in kale harvested on the 31st day after the date of sowing, after the light treatment was performed in comparative example 3, experimental example 5, and experimental example 6.
Figure 12B:
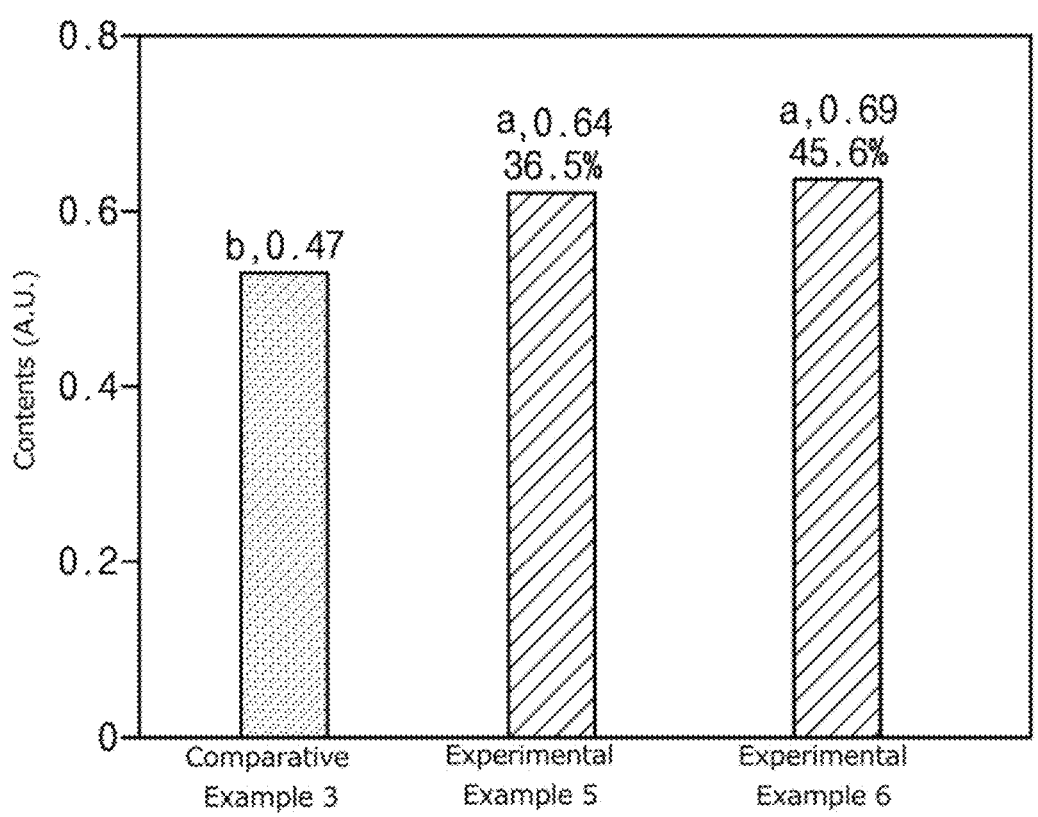
FIG. 12B is a graph sequentially showing contents of flavonols contained in kale harvested on the 31st day after the date of sowing, after the light treatment was performed in comparative example 3, experimental example 5, and experimental example 6.
Figures 12C, 13:
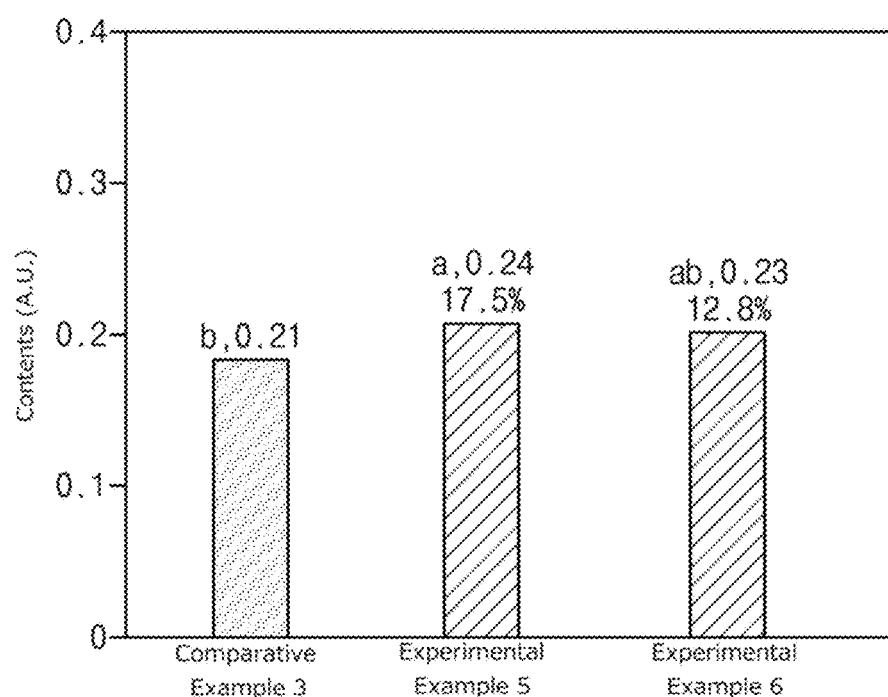
FIG. 12C is a graph sequentially showing contents of anthocyanins contained in kale harvested on the 31st day after the date of sowing, after the light treatment was performed in comparative example 3, experimental example 5, and experimental example 6.
FIG. 13 shows experimental conditions in an embodiment.

FIGS. 12A to 12C are graphs sequentially showing contents of chlorophylls, flavonols, and anthocyanins contained in the kale harvested on the 31st day after the date of sowing in comparative example 3, experimental example 5, and experimental example 6.

Referring to FIGS. 12A to 12C, the content of the active ingredient varied from one active ingredient to another depending on whether the light is irradiated in the continuous method or in the on and off method. In the case of chlorophylls, there was no meaningful difference in the content of chlorophylls between the control group and experimental example 5, but in experimental example 6, the content of chlorophylls was significantly increased as compared with the control group. In the case of flavonols, the content of flavonols in experimental examples 5 and 6 was significantly increased as compared with the control group. In the case of anthocyanins, the content of anthocyanins in experimental example 5 was significantly increased as compared with the control group. However, in experimental example 6, the content of anthocyanins was increased as compared with the control group, but the difference was not meaningful. However, a tendency of the active ingredient content to increase by the light irradiation was evident, and it was found that the increase of the content of the active ingredients was greater in the case of continuous light irradiation than in the case of on and off light irradiation.

5. Whether the Active Ingredient Content is Increased when the UVB is Irradiated Under the Dark Period In the present experiment, influences on the plants depending on whether the light corresponding to the UVB is irradiated in the dark period or is irradiated in the light period were observed.

FIG. 13 shows experimental conditions in the present exemplary embodiment and corresponds to the control group and treatment group 1 of FIG. 4. In detail, in FIG. 13, comparative example 4 corresponds to the control group of FIG. 4, and the dark period and the light period were respectively maintained during about 8 hours and about 16 hours during the last day (for 1 day) before harvesting. Each of experimental example 7 and experimental example 8 corresponds to treatment group 1 of FIG. 4. However, in experimental example 8, the light having the spectrum corresponding to the UVB was irradiated in the dark period for about 3 hours, and the light having the spectrum corresponding to FIG. 3B was irradiated in the light period for about 16 hours. In this case, the light provided in the dark period was only the UVB, and the light in the visible light wavelength band was not provided. (The second period in which the UVB is provided is marked by "*".) In experimental example 7, the light having the spectrum corresponding to FIG. 3C was provided for about 3 hours in the light period, and the light having the spectrum corresponding to FIG. 3B was provided for about 13 hours corresponding to a remaining light period. The total energy amount shown in FIG. 13 was a value corresponding to the ultraviolet wavelength band except the visible light. In the present exemplary embodiment, the total energy amount of the UVB in experimental examples 7 and 8 was about 1.08 kJ/m².

Figure 14A:
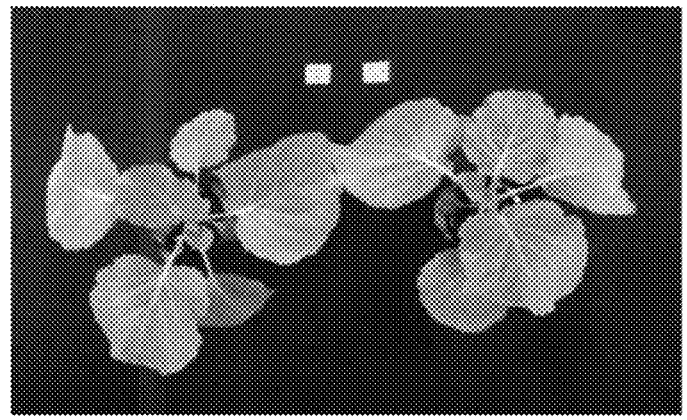
FIG. 14A is a photograph showing experimental results of experimental example 7.
Figure 14B:
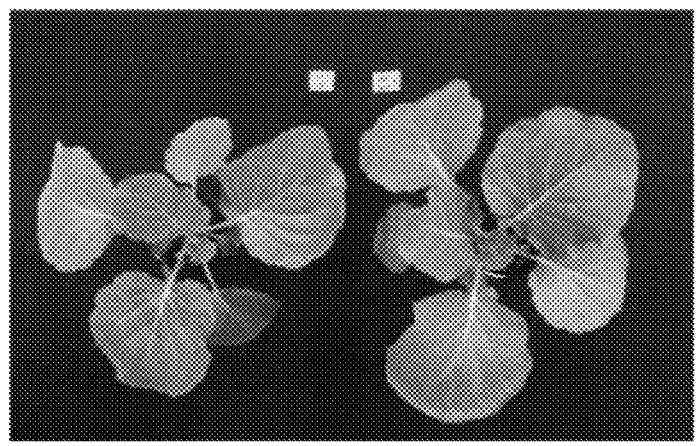
FIG. 14B is a photograph showing experimental results of experimental example 8.
Figure 14C:
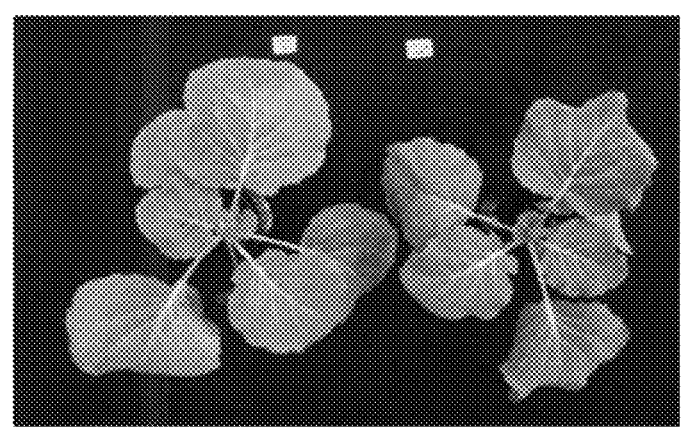
FIG. 14C is another photograph showing experimental results of experimental example 7.
Figure 14D:
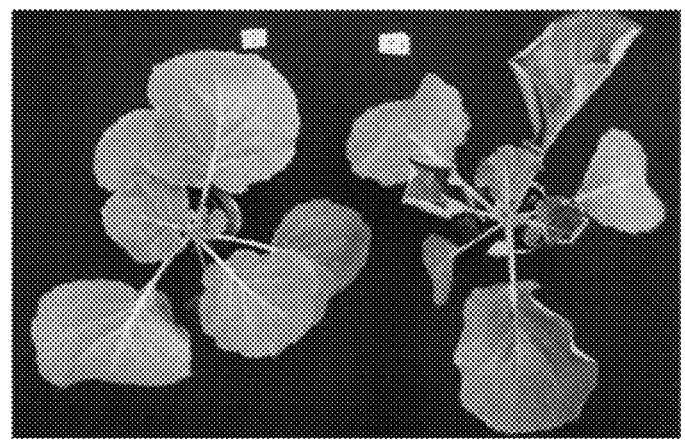
FIG. 14D is another photograph showing experimental results of experimental example 8.

FIGS. 14A to 14D are photographs showing experimental results of comparative example 4, experimental example 7, and experimental example 8. In FIGS. 14A to 14D, the kale on the left side in each photograph corresponds to the control group. The photograph on the right side of FIG. 14A is a photograph of the kale at a point in time where one day has elapsed after the light was applied according to the light condition described in experimental example 7, and the photograph on the right side of FIG. 14B is a photograph of the kale at a point in time where one day has elapsed after the light was applied according to the light condition described in experimental example 8. The photograph on the right side of FIG. 14C is a photograph of the kale at a point in time where 4 days have elapsed after the light was applied according to the light condition described in experimental example 7, and the photograph on the right side of FIG. 14D is a photograph of the kale at a point in time where 4 day have elapsed after the light was applied according to the light condition described in experimental example 8.

Referring to FIGS. 14A to 14D, in the case where the light corresponding to the UVB was applied to the plants in the dark period, the damage on the plants was not observed at the time point where one day has elapsed, however, leaf curling and browning phenomena were observed in the kale at the time point where 4 days have elapsed. In the case where the light corresponding to the UVB was applied to the plants in the light period, the damage of the plants was not observed at both time points where one day has elapsed and where 4 days have elapsed. Through this, it was found that the UVB easily damages the plants in the dark period rather than in the light period.

Figure 15A:
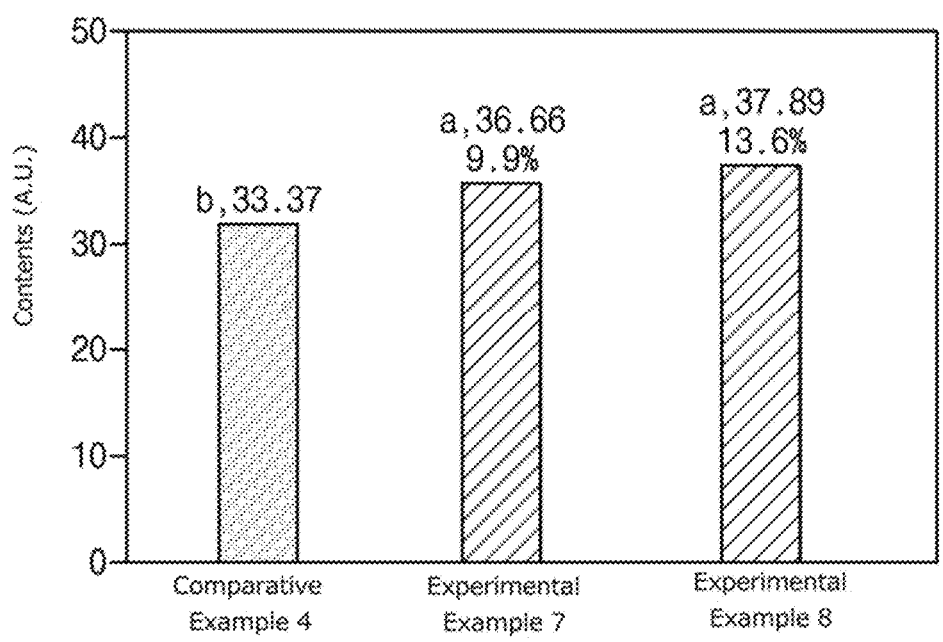
FIG. 15A is a graph sequentially showing contents of chlorophylls contained in kale harvested on the 31st day after the date of sowing, after the light treatment was performed in comparative example 4, experimental example 7, and experimental example 8.
Figure 15B:
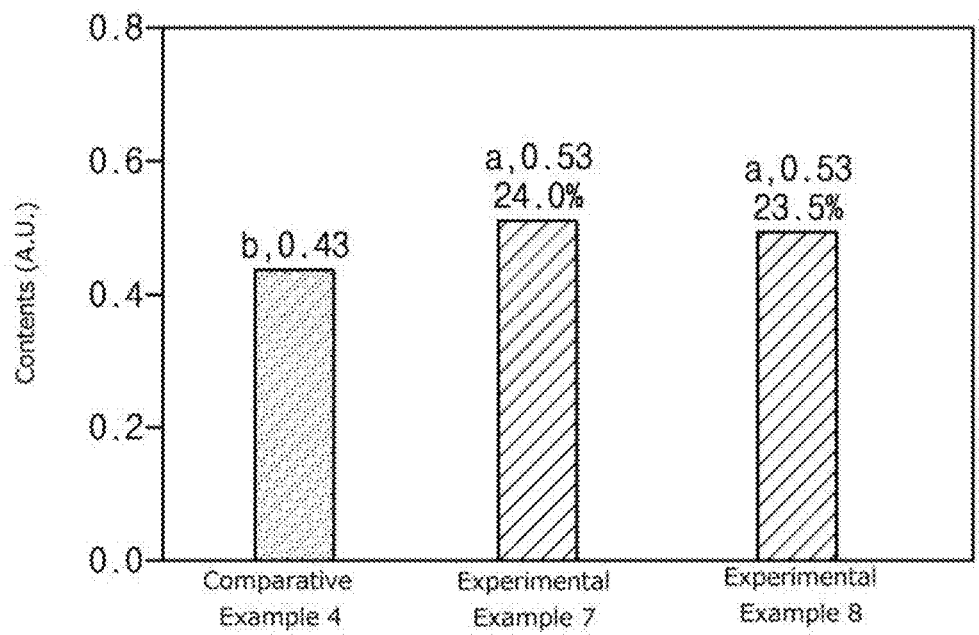
FIG. 15B is a graph sequentially showing contents of flavonols contained in kale harvested on the 31st day after the date of sowing, after the light treatment was performed in comparative example 4, experimental example 7, and experimental example 8.
Figure 15C:
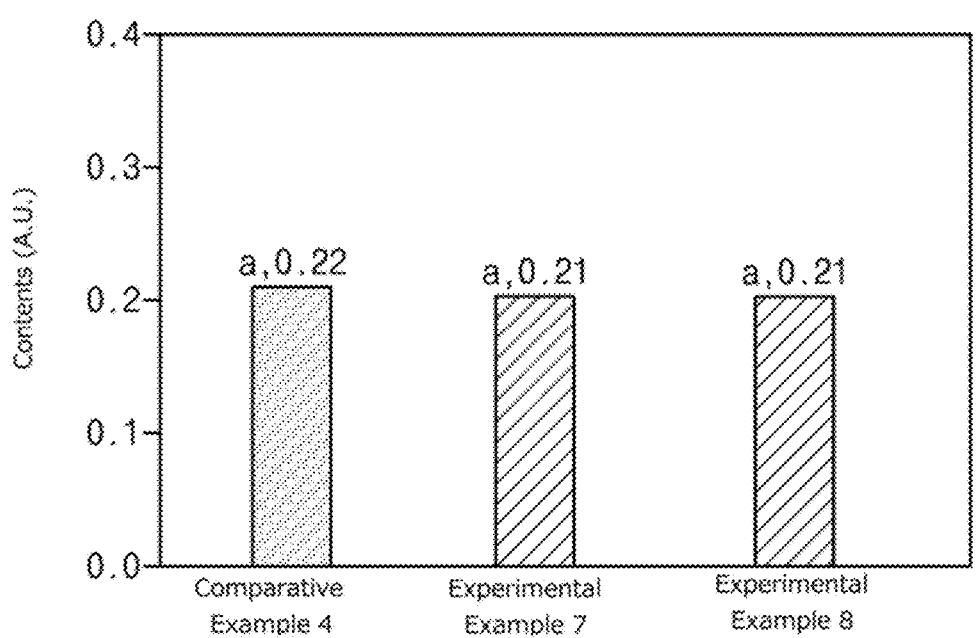
FIG. 15C is a graph sequentially showing contents of anthocyanins contained in kale harvested on the 31st day after the date of sowing, after the light treatment was performed in comparative example 4, experimental example 7, and experimental example 8.

FIGS. 15A to 15C are graphs sequentially showing contents of chlorophylls, flavonols, and anthocyanins contained in the kale harvested on the 31st day after the date of sowing in comparative example 4, experimental example 7, and experimental example 8.

Referring to FIGS. 15A to 15C, in the case where the light corresponding to the UVB was applied to the plants in the light period or the dark period, the content of chlorophylls and the content of flavonols among the active ingredients were significantly increased. However, in the case of anthocyanins, no meaningful increase in the active ingredient content was found.

6. Whether UVB Irradiation Under the Light Cycle Increases the Predetermined Substance Content of Various Cruciferous Plants In this experiment, the effects of cruciferous plants were observed when no UVB light was irradiated and when irradiated in the light period. To this end, in the following examples, additional experiments were conducted on a tatsoi (Asia vitamin), mustard, and broccoli among cruciferous plants.

FIG. 16 shows experimental conditions in an embodiment, in which comparative examples and experimental examples correspond to comparative example 4 and experimental example 7 of FIG. 13, respectively, and the experimental conditions are the same between each other. FIGS.

17A to 17C are graphs sequentially showing contents of chlorophylls, flavonols, and anthocyanins contained in tatsoi, mustard, and broccoli harvested on the 31st day after the date of sowing, after the light treatment was performed in comparative examples and experimental examples according to the experimental conditions of FIG. 16.

Figure 17C:
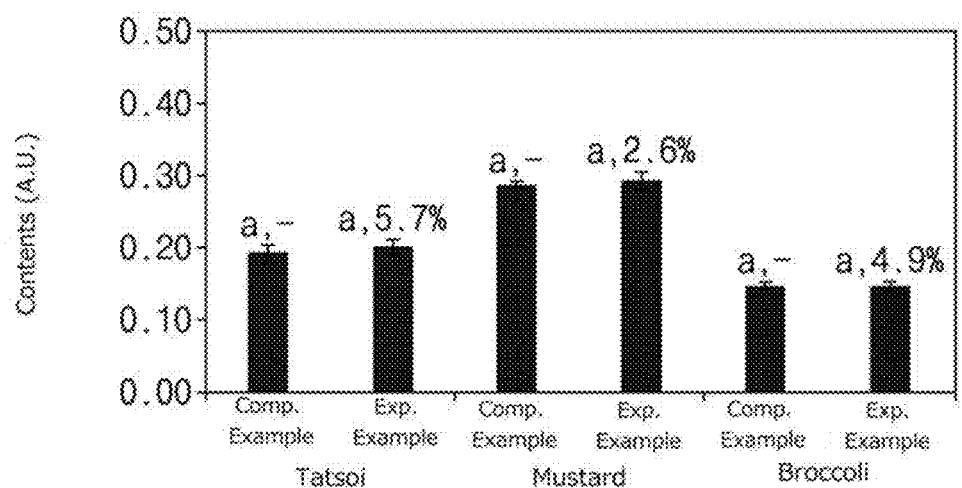
FIG. 17C is a graph sequentially showing contents of anthocyanins contained in tatsoi, mustard, and broccoli harvested on the 31st day after the date of sowing, after the light treatment was performed in comparative examples and experimental examples according to the experimental conditions of FIG. 16.

Referring to FIGS. 17A to 17C, in the case of the experimental example irradiated with UVB in the light period, the content of the chlorophylls, flavonols, anthocyanins are all increased compared to the comparative example not irradiated. In particular, in the case of chlorophylls, a significant increase of the contents for tatsoi (Asia vitamin) and mustard was observed in the experimental example with UVB irradiation in the light period. In the case of flavonols, a significant increase of the contents for all of tatsoi, mustard, and broccoli was observed in the experimental example with UVB irradiation in the light period. In the case of anthocyanins, the contents for tatsoi, mustard and broccoli were not so remarkably increased, but still considerably increased.

Figure 18A:
FIG. 18A is a photograph showing the experimental results of the comparative (right photograph) example and the experimental example (left photograph) according to the experimental conditions of FIG. 16.
Figure 18B:
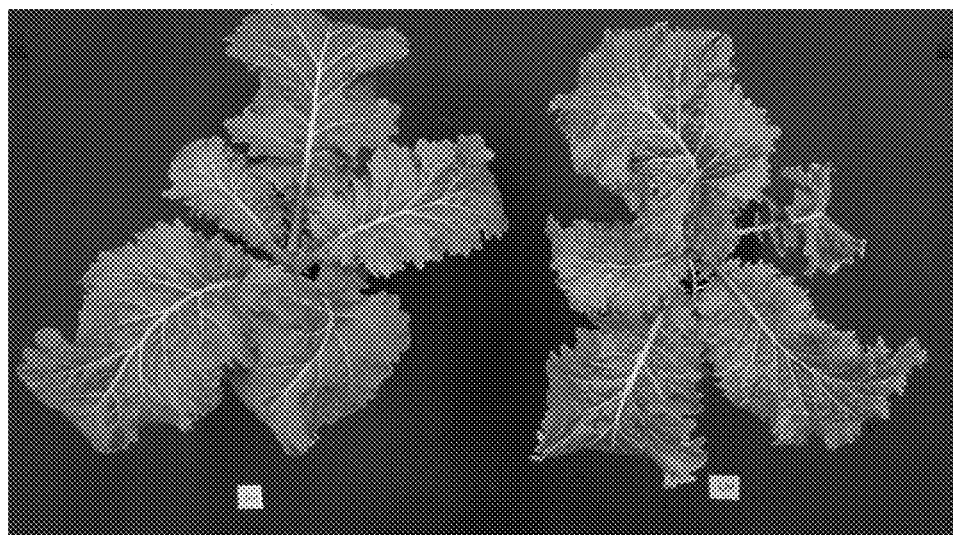
FIG. 18B is another photograph showing the experimental results of the comparative example (right photograph) and the experimental example (left photograph) according to the experimental conditions of FIG. 16.
Figure 18C:
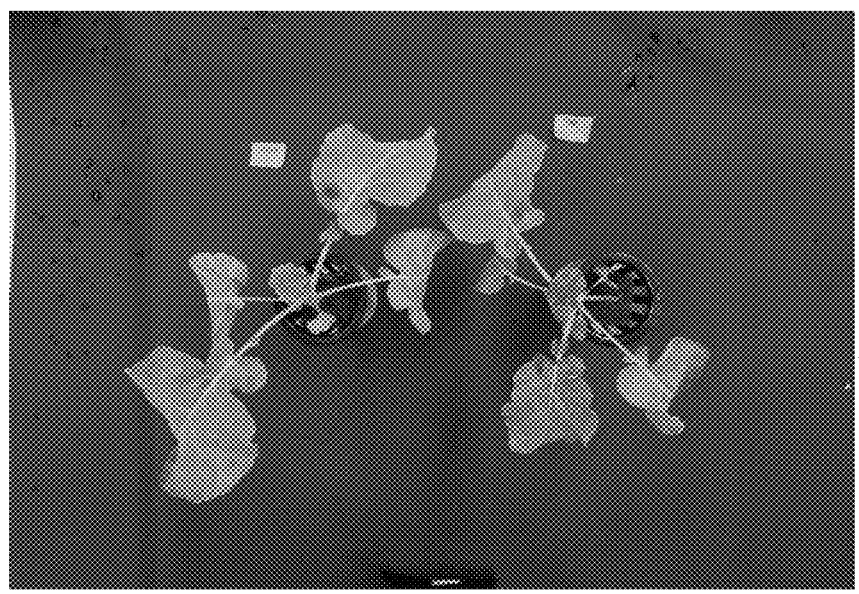
FIG. 18C is further another photograph showing the experimental results of the comparative example (right photograph) and the experimental example (left photograph) according to the experimental conditions of FIG. 16.

FIGS. 18A to 18C are photographs showing the experimental results of the comparative example and the experimental example according to the experimental conditions of FIG. 16. Referring to FIGS. 18A to 18C, in the case of the experimental example irradiated with UVB in the light period, no special change in appearance, for example, leaf-curling, browning, and death was not found compared to the comparative example which is not irradiated. As could be seen from the above-described embodiments, the light source according to the exemplary embodiment of the present disclosure provides the light having the specific wavelength to the adult plants in a specified method during the predetermined period, and thus the plants with the high active ingredient content may be obtained.

The light source according to the exemplary embodiment of the present disclosure may be used for plant cultivation, and in detail, the light source may be applied to a plant cultivation device and a greenhouse each in which a light source is installed.

Figure 19:
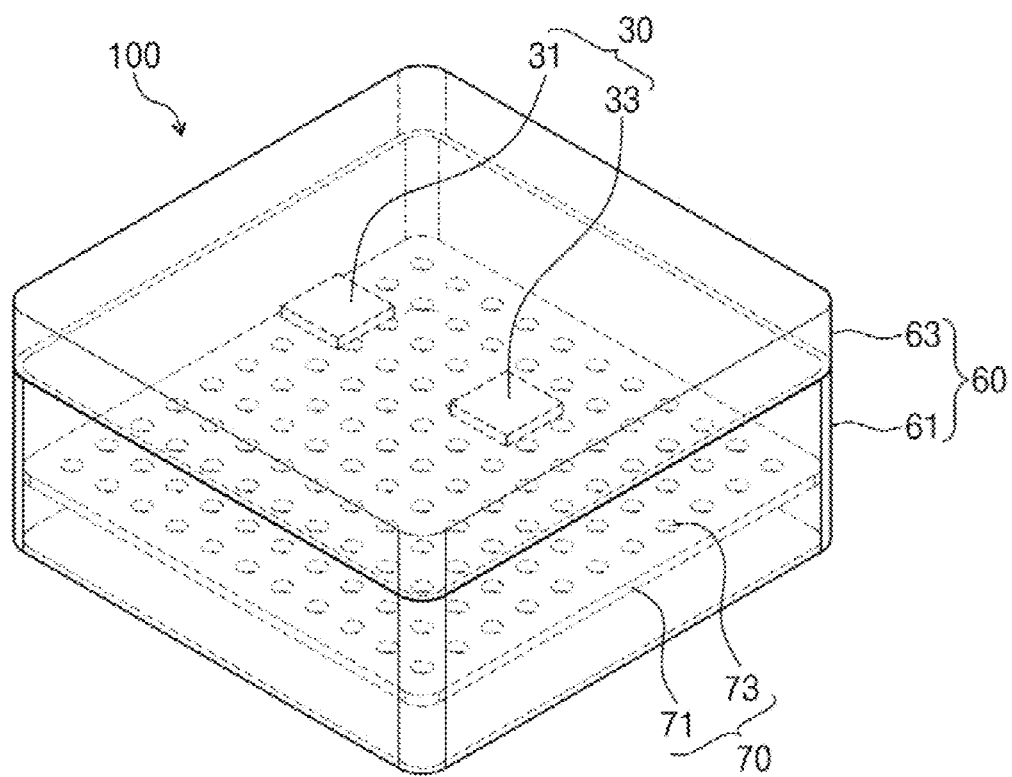
FIG. 19 is a perspective view conceptually showing a cultivation device according to an exemplary embodiment of the present disclosure.

FIG. 19 is a perspective view showing a cultivation device according to an exemplary embodiment of the present disclosure. The cultivation device shown in FIG. 19 corresponds to a small-sized cultivation device; however, it should not be limited thereto or thereby.

Referring to FIG. 19, the cultivation device 100 according to the exemplary embodiment of the present disclosure includes a housing 60 having an inner space capable of growing the plants and a light source 30 provided in the housing 60 to emit a light.

The housing 60 provides an empty space therein within which the plants may be provided and may be grown. The housing 60 may be provided in a box shape that is capable of blocking an external light. In some embodiments, the housing 60 may include a lower case 61 opened upward and an upper case 63 opened downward. The lower case 61 and the upper case 63 may be coupled to each other to form the box shape that blocks the external light.

The lower case 61 includes a bottom portion and a sidewall portion extending upward from the bottom portion. The upper case 63 includes a cover portion and a sidewall portion extending downward from the cover portion. The sidewall portions of the lower case 61 and the upper case 63 may have structures engaged with each other. The lower case 61 and the upper case 63 may be coupled to each other or separated from each other depending on a user's intention, and thus a user may open or close the housing 60.

The housing 60 may be provided in various shapes. For example, the housing 60 may have a substantially rectangular parallelepiped shape or may have a cylindrical shape. However, the shape of the housing 60 should not be limited thereto or thereby, and the housing 60 may be provided in other shapes.

The housing 60 provides an environment in which the plants provided therein may be grown. The housing 60 may have a size that is capable of accommodating a plurality of plants provided and grown therein. In addition, the size of the housing 60 may be changed depending on a use of the plant cultivation device 100. For example, in a case where the plant cultivation device 100 is used for a small-scale plant cultivation at home, the size of the housing 60 may be relatively small. In a case where the plant cultivation device 100 is used for commercial plant cultivation, the size of the housing 60 may be relatively large.

In some embodiments, the housing 60 may block the light such that the external light is not incident into the housing 60. Accordingly, a dark room environment, which is isolated from the outside, may be provided inside the housing 60. Therefore, the external light may be prevented from being unnecessarily irradiated to the plants provided inside the housing 60. In particular, the housing 60 may prevent an external visible light from being irradiated to the plants. However, in some cases, the housing 60 may be designed to be partially opened, and thus the housing 60 may receive the external light as it is.

The space inside the housing 60 may be provided as one space. However, this is for the convenience of explanation, and the space inside the housing 60 may be divided into a plurality of compartments. That is, partition walls may be provided in the housing 60 to divide the space inside the housing 60 into the compartments.

The light source provides the light to the plants in the space of the housing 60. The light source is disposed on an inner surface of the upper case 63 or the lower case 61. The light source may be disposed on the cover portion of the upper case 63. The light source disposed on an inner surface of the cover portion of the upper case 63 is shown, however, it should not be limited thereto or thereby. For example, the light source may be disposed on the sidewall portion of the upper case 63. As another example, the light source may be disposed on the sidewall portion of the lower case 61, e.g., on an upper end of the sidewall portion. As further another example, the light source may be disposed on at least one of the cover portion of the upper case 63, the sidewall portion of the upper case 63, and the sidewall portion of the lower case 61.

A culture platform 70 may be provided in the space of the housing 60 to cultivate the plant easily, for example, for facilitating a hydroponic culture. The culture platform 70 may include a plate-shaped plate 71 disposed at a position spaced apart upward from the bottom portion of the housing 60. Through-holes 73 with a uniform size may be provided through the plate 71. The culture platform 70 may be provided to allow the plants to be grown on an upper surface of the plate 71 and may include a plurality of through-holes 73 to allow water supplied thereto to be drained when the water is supplied. The through-hole 73 may be provided in a size such that the plants do not slip through. For example, the through-hole 73 may have a diameter smaller than the plants. A space between the culture platform 70 and the bottom portion of the lower case 61 may serve as a water tank in which the drained water is stored. Accordingly, the water drained downward through the through-hole 73 of the culture platform 70 may be stored in the space between the bottom portion of the lower case 61 and the culture platform 70.

However, in some embodiments, plants in the family Poaceae may also be cultivated by methods other than the hydroponic culture method. In this case, water, a culture medium, and soil may be provided in the space of the housing 60 to supply the water and/or nutrients necessary for the plants in the family Poaceae, and the housing 60 may serve as a container. The culture medium or the soil may contain the nutrients for the plants to grow, such as potassium (K), calcium (Ca), magnesium (Mg), sodium (Na), and iron (Fe). The seeds may be provided while being imbedded in the culture medium or may be placed on a surface of the culture medium depending on its type.

The culture platform 70 may have a size and a shape, which vary depending on the shape of the housing 60 and the providing manner of a first light source and a second light source. The size and the shape of the culture platform 70 may be configured to allow the plants provided on the culture platform 70 to be placed within an irradiation range of the light irradiated from the first light source and the second light source.

The housing 60 may include a water supply unit disposed therein to supply water to the plants. The water supply unit may be configured to be disposed at an upper end of the housing 60, e.g., on the inner surface of the cover portion of the upper case 63, and to spray water onto the culture platform 70. However, the configuration of the water supply unit should not be limited thereto or thereby, and the configuration of the water supply unit may vary depending on the shape of the housing 60 and the arrangement of the culture platform 70. In addition, the user may directly supply the water into the housing 60 without a separate water supply unit.

The water supply unit may be provided in a singular or plural number. The number of the water supply units may be changed depending on the size of the housing 60. For instance, in the case of the relatively small-sized plant cultivation device for the home usage, one water supply unit may be used since the size of the housing is small. In the case of the relatively large-sized commercial plant cultivation device, the plural water supply units may be used since the size of the housing 60 is large. However, the number of the water supply units should not be limited thereto or thereby and may be provided in a variety of positions in various numbers.

The water supply unit may be connected to a water tank provided in the housing 60 or a faucet outside the housing 60. In addition, the water supply unit may further include a filtration unit such that contaminants floating in the water are not provided to the plants. The filtration unit may include a filter, such as an activated carbon filter or a non-woven fabric filter, and thus the water passing through the filtration unit may be purified. The filtration unit may further include a light irradiation filter. The light irradiation filter may remove germs, bacteria, fungal spores, and the like, which are present in the water, by irradiating an ultraviolet light or the like to the water. As the water supply unit includes the above-mentioned filtration unit, there is no possibility that the inside of the house 60 and the plants are contaminated even when water is recycled or rainwater or the like is directly used for the cultivation.

The water provided from the water supply unit may be provided as plain water itself (for example, purified water) without additional nutrients, however, it should not be limited thereto or thereby, and the water provided from the water supply unit may contain nutrients necessary for the growth of the plant. For example, the water may contain a material, such as potassium (K), calcium (Ca), magnesium (Mg), sodium (Na), and iron (Fe), and a material, such as nitrate, phosphate, sulfate, and chloride (Cl). For instance, Sachs's solution, Knop's solution, Hoagland's solution, or Hewitt's solution may be supplied from the water supply unit.

According to the exemplary embodiment, the plants may be cultivated using the light source.

A plant cultivation method according to an exemplary embodiment of the present disclosure may include germinating a seed of the plants and providing the light in the visible light wavelength band to the germinated plant. The light provided to the plants is emitted from the light sources according to the above-described embodiments, and the light in the visible light wavelength band may include at least two or three lights among first, second, third, and fourth lights having different light spectra from each other.

Although the exemplary embodiments of the present disclosure have been described, it is understood that the present disclosure should not be limited to these exemplary embodiments but various changes and modifications can be made by one ordinary skilled in the art within the spirit and scope of the present disclosure as hereinafter claimed.

Therefore, the disclosed subject matter should not be limited to any single embodiment described herein, and the scope of the present disclosure shall be determined according to the attached claims.

What is claimed is:

1. A plant cultivation light source, comprising:
a light source module configured to emit a light to a plant, the light source module including:
 a controller operable to turn on the light module during a light period,
 a first light emitter having a first active layer emitting light having a first peak wavelength within a first color wavelength band range,
 a second light emitter having a second active layer emitting light having a second peak wavelength within a second wavelength band range, and
 a third light emitter having a third active layer emitting light having a third peak wavelength within a third color wavelength band range,
wherein the controller operates the first light emitter to emit light having a relatively high intensity,
wherein the controller operates the third light emitter to emit light having a lower intensity than the first peak wavelength,
wherein the light period comprises a first period and a second period, and
wherein the controller uses at most two of the first, second, and third light emitters for at least one growth stage of the plant during the second period.

2. The plant cultivation light source of claim 1, wherein the controller controls the light module to emit light having a first spectral pattern in the first period that enables photosynthesis of the plant.

3. The plant cultivation light source of claim 1, wherein the controller controls the light module to emit light having a second spectral pattern in the second period that increases a content of a predetermined substance in the plant.

4. The plant cultivation light source of claim 1, wherein each light emitter further comprises a first semiconductor layer, a second semiconductor layer and a first and a second electrodes.

5. The plant cultivation light source of claim 4, wherein the light source module further comprises a substrate having a printed circuit, wherein the printed circuit electrically connects to the light emitters through the first and the second electrodes.

6. The plant cultivation light source of claim 1, wherein:
the first light emitter has a first energy band gap of the first active layer, and
the second light emitter has a second energy band gap of the second active layer,
wherein the first energy band gap has a longer peak wavelength than the second energy band gap.

7. The plant cultivation light source of claim 6, wherein:
the third light emitter has a third energy band gap of the third active layer,
wherein the second energy band gap has a longer peak wavelength than the third energy band gap.

8. The plant cultivation light source of claim 1, wherein the controller is further operable to alternate the first period and the second period during the light period.

9. The plant cultivation light source of claim 1, wherein the controller further controls the light source module to continuously irradiate the light in the second period.

10. A plant cultivation light source, comprising:
a first light emitter having a first energy band gap of a first active layer,
a second light emitter having a second energy band gap of a second active layer, and
a third light emitter having a third energy band gap of a third active layer,
a controller operable to turn on one or more of the first, second, and third light emitters during a light period,
wherein the first energy band gap has longer peak wavelength than the second energy band gap,
wherein the second energy band gap has longer peak wavelength than the third energy band gap,
wherein the light period comprises a first period and a second period, and
wherein at least one of the first, second, third light emitter is off depending on a growth stage of the plant during the second period.

11. The plant cultivation light source of claim 10, wherein the controller operates the light emitters to emit light having a first spectral pattern in the first period that enables photosynthesis of the plant.

12. The plant cultivation light source of claim 10, wherein the controller operates the light emitters to emit light having a second spectral pattern in the second period that increases a content of a predetermined substance in the plant.

13. The plant cultivation light source of claim 10, wherein each light emitter further comprises a first semiconductor layer, a second semiconductor layer and a first and a second electrodes.

14. The plant cultivation light source of claim 13, further comprising a substrate having a printed circuit, wherein the printed circuit electrically connects to the light emitters through the first and the second electrodes.

15. The plant cultivation light source of claim 10, wherein the controller is further operable to alternate the first period and the second period during the light period.

16. The plant cultivation light source of claim 10, wherein the controller further controls the light emitters to continuously irradiate the light in the second period.

17. A plant cultivation device comprising:
a housing having an inner space capable of growing plants;
a light source disposed on the housing and configured to emit light into the inner space; and
a controller disposed on the housing and operable to turn on one or more emitters in the light source during a light period,
wherein the light source includes:
a first light emitter having a first active layer emitting light having a first peak wavelength within a first color wavelength band range,
a second light emitter having a second active layer emitting light having a second peak wavelength within a second wavelength band range, and
a third light emitter having a third active layer emitting light having a third peak wavelength within a third color wavelength band range,
wherein the first peak wavelength has a relatively high intensity,
wherein the third peak wavelength has a lower intensity than the first peak wavelength,
wherein the light period comprises a first period and a second period, and
wherein at least one of the first, second, and third light emitters is off for at least one growth stage of the plant during the second period.

18. The plant cultivation device of claim 17, wherein:
the first light emitter has a first energy band gap of the first active layer, and
the second light emitter has a second energy band gap of the second active layer,
wherein the first energy band gap has a longer peak wavelength than the second energy band gap.

19. The plant cultivation device of claim 17, further comprising a culture platform configured for placement in the inner space of the housing for cultivating the plants, wherein the culture platform includes a plate disposed at a position spaced apart upward from a bottom portion of the housing, wherein the plate includes a plurality of through-holes having a uniform size.

20. The plant cultivation device of claim 17, further comprising at least one water supply unit to supply water to the plants.

* * * * *